United States Patent
Scott

[19]

[11] Patent Number: 5,986,860
[45] Date of Patent: Nov. 16, 1999

[54] ZONE ARC FAULT DETECTION

[75] Inventor: Gary W. Scott, Mount Vernon, Iowa

[73] Assignee: Square D Company, Palatine, Ill.

[21] Appl. No.: 09/026,203

[22] Filed: Feb. 19, 1998

[51] Int. Cl.$^6$ .................................................. H02H 3/00
[52] U.S. Cl. ................... 361/42; 361/45; 361/115
[58] Field of Search ...................... 361/18, 42, 45, 361/58, 69, 62, 64, 66, 78, 93, 96, 115, 2

[56] References Cited

U.S. PATENT DOCUMENTS

| | | | |
|---|---|---|---|
| H536 | 10/1988 | Strickland et al. | 324/456 |
| H538 | 11/1988 | Betzold | 89/134 |
| Re. 30,678 | 7/1981 | Van Zeeland et al. | 361/44 |
| 2,808,566 | 10/1957 | Douma | 324/127 |
| 2,832,642 | 4/1958 | Lennox | 299/132 |
| 2,898,420 | 8/1959 | Kuze | 200/87 |
| 3,471,784 | 10/1969 | Arndt et al. | 324/126 |
| 3,538,241 | 11/1970 | Rein | 174/143 |
| 3,588,611 | 6/1971 | Lambden et al. | 317/31 |
| 3,600,502 | 8/1971 | Wagenaar et al. | 174/143 |
| 3,622,872 | 11/1971 | Boaz et al. | 324/52 |
| 3,684,955 | 8/1972 | Adams | 324/72 |
| 3,746,930 | 7/1973 | Van Best et al. | 317/31 |
| 3,775,675 | 11/1973 | Freeze et al. | 324/51 |
| 3,812,337 | 5/1974 | Crosley | 235/153 AC |
| 3,858,130 | 12/1974 | Misencik | 335/18 |
| 3,869,665 | 3/1975 | Kenmochi et al. | 324/72 |
| 3,878,460 | 4/1975 | Nimmersjo | 324/52 |
| 3,911,323 | 10/1975 | Wilson et al. | 317/18 |
| 3,912,979 | 10/1975 | Mikami et al. | 361/69 |

(List continued on next page.)

FOREIGN PATENT DOCUMENTS

| | | | |
|---|---|---|---|
| 0094 871A1 | 5/1983 | European Pat. Off. | H02H 1/00 |
| 0615327A2 | 9/1994 | European Pat. Off. | H02H 1/00 |
| 0649207A1 | 4/1995 | European Pat. Off. | H02H 3/04 |
| 0748021A1 | 12/1996 | European Pat. Off. | H02H 1/00 |
| 0762591A2 | 3/1997 | European Pat. Off. | H02H 3/33 |
| 0802602A2 | 10/1997 | European Pat. Off. | H02H 1/00 |
| 0813281A2 | 12/1997 | European Pat. Off. | H02H 1/00 |
| 2177561A | 6/1985 | United Kingdom | H02H 3/00 |
| 2285886A | 7/1995 | United Kingdom | H01H 71/74 |
| WO 97/30501 | 8/1997 | WIPO | H02H 1/00 |

OTHER PUBLICATIONS

Antonio N. Paolantonio, P.E., Directional Couplers, R.F. Design, Sep./Oct., 1979, pp. 40–49.

Alejandro Duenas, J., Directional Coupler Design Graphs For Parallel Coupled Lines and Interdigitated 3 dB Couplers, RF Design, Feb., 1986, pp. 62–64.

RV4145 Low Power Ground Fault Interrupter, Preliminary Product Specifications of Integrated Circuits, Raytheon Company Semiconductor Division, 350 Ellis Street, Mountain View CA 94309–7016, pp. 1–8.

Jean–Francois Joubert, Feasibility of Main Service Ground–Fault Protection On The Electrical Service To Dwelling Units, Consultants Electro–Protection Ins., 1980, Michelin St., Laval, Quebec H7L 9Z7. Oct., 26, 1990, pp. 1–77.

B.D. Russell, Detection Of Arcing Faults On Distribution Feeders, Texas A & M Research Foundation, Box H. College Station, Texas 77843, Final Report Dec., 1982, pp. 1–B18.

*Primary Examiner*—Stephen W Jackson
*Attorney, Agent, or Firm*—Kareem M. Irfan; Larry I. Golden

[57] ABSTRACT

A number of methods can be used for zone arc protection to detect series and/or shunt arcing faults in various electrical components and/or circuits. A differential current detector, or a di/dt based detector, may be used to detect shunt arcs, while a differential voltage detector or a zero-sequence voltage detector, is used to detect series arcs. A differential phase current detection scheme may be used for both shunt arcs and series arcs. Series arcs may also be detected using a voltage drop system or a line power loss system. Detection of arcing in joints may be monitored directly. A ground fault detector may be combined with one or more of these systems for detecting a ground fault in the circuit to be protected. Two or more of the above systems or detectors may be combined for arc monitoring and detection.

59 Claims, 14 Drawing Sheets

U.S. PATENT DOCUMENTS

| | | | |
|---|---|---|---|
| 3,914,667 | 10/1975 | Waldron | 317/36 |
| 3,932,790 | 1/1976 | Muchnick | 317/18 D |
| 3,939,410 | 2/1976 | Bitsch et al. | 324/72 |
| 4,052,751 | 10/1977 | Shepard | 361/50 |
| 4,074,193 | 2/1978 | Kohler | 324/126 |
| 4,081,852 | 3/1978 | Coley et al. | 361/45 |
| 4,087,744 | 5/1978 | Olsen | 324/51 |
| 4,156,846 | 5/1979 | Harrold et al. | 324/158 |
| 4,169,260 | 9/1979 | Bayer | 340/562 |
| 4,214,210 | 7/1980 | O'Shea | 455/282 |
| 4,233,640 | 11/1980 | Klein et al. | 361/44 |
| 4,245,187 | 1/1981 | Wagner et al. | 324/54 |
| 4,251,846 | 2/1981 | Pearson et al. | 361/30 |
| 4,264,856 | 4/1981 | Frierdich et al. | 322/25 |
| 4,316,187 | 2/1982 | Spencer | 340/664 |
| 4,354,154 | 10/1982 | Olsen | 324/51 |
| 4,356,443 | 10/1982 | Emery | 324/51 |
| 4,387,336 | 6/1983 | Joy et al. | 324/51 |
| 4,459,576 | 7/1984 | Fox et al. | 336/84 |
| 4,466,071 | 8/1984 | Russell, Jr. | 364/492 |
| 4,616,200 | 10/1986 | Fixemer et al. | 335/35 |
| 4,639,817 | 1/1987 | Cooper et al. | 361/62 |
| 4,642,733 | 2/1987 | Schacht | 361/363 |
| 4,644,439 | 2/1987 | Taarning | 361/87 |
| 4,652,867 | 3/1987 | Masot | 340/638 |
| 4,658,322 | 4/1987 | Rivera | 361/37 |
| 4,697,128 | 9/1987 | Nicolas | 633/882 |
| 4,702,002 | 10/1987 | Morris et al. | 29/837 |
| 4,707,759 | 11/1987 | Bodkin | 831/642 |
| 4,771,355 | 9/1988 | Emery et al. | 361/33 |
| 4,810,954 | 3/1989 | Fam | 324/142 |
| 4,833,564 | 5/1989 | Pardue et al. | 361/93 |
| 4,835,648 | 5/1989 | Yamauchi | 361/14 |
| 4,845,580 | 7/1989 | Kitchens | 361/91 |
| 4,853,818 | 8/1989 | Emery et al. | 361/33 |
| 4,858,054 | 8/1989 | Franklin | 361/57 |
| 4,866,560 | 9/1989 | Allina | 361/104 |
| 4,882,682 | 11/1989 | Takasuka et al. | 364/507 |
| 4,893,102 | 1/1990 | Bauer | 335/132 |
| 4,901,183 | 2/1990 | Lee | 361/56 |
| 4,922,368 | 5/1990 | Johns | 361/62 |
| 4,931,894 | 6/1990 | Legatti | 361/45 |
| 4,939,495 | 7/1990 | Peterson et al. | 337/79 |
| 4,949,214 | 8/1990 | Spencer | 361/95 |
| 4,969,063 | 11/1990 | Scott et al. | 361/93 |
| 5,010,438 | 4/1991 | Brady | 361/56 |
| 5,047,724 | 9/1991 | Boksiner et al. | 324/520 |
| 5,051,731 | 9/1991 | Guim et al. | 340/638 |
| 5,121,282 | 6/1992 | White | 361/42 |
| 5,166,861 | 11/1992 | Krom | 361/379 |
| 5,168,261 | 12/1992 | Weeks | 340/515 |
| 5,179,491 | 1/1993 | Runyan | 361/45 |
| 5,185,684 | 2/1993 | Beihoff et al. | 361/45 |
| 5,185,685 | 2/1993 | Tennies et al. | 361/45 |
| 5,185,686 | 2/1993 | Hansen et al. | 361/45 |
| 5,185,687 | 2/1993 | Beihoff et al. | 361/45 |
| 5,206,596 | 4/1993 | Beihoff et al. | 324/536 |
| 5,208,542 | 5/1993 | Tennies et al. | 324/544 |
| 5,223,795 | 6/1993 | Blades | 324/536 |
| 5,224,006 | 6/1993 | MacKenzie et al. | 361/45 |
| 5,257,157 | 10/1993 | Epstein | 361/111 |
| 5,280,404 | 1/1994 | Ragsdale | 361/113 |
| 5,286,933 | 2/1994 | Pham | 200/144 B |
| 5,307,230 | 4/1994 | MacKenzie | 361/96 |
| 5,334,939 | 8/1994 | Yarbrough | 324/424 |
| 5,353,014 | 10/1994 | Carroll et al. | 340/638 |
| 5,359,293 | 10/1994 | Boksiner et al. | 324/544 |
| 5,363,269 | 11/1994 | McDonald | 361/45 |
| 5,383,084 | 1/1995 | Gershen et al. | 361/113 |
| 5,388,021 | 2/1995 | Stahl | 361/56 |
| 5,396,179 | 3/1995 | Domenichini et al. | 324/546 |
| 5,412,526 | 5/1995 | Kapp et al. | 361/56 |
| 5,412,590 | 5/1995 | Tajali | 361/669 |
| 5,420,740 | 5/1995 | MacKenzie et al. | 361/45 |
| 5,424,894 | 6/1995 | Briscall et al. | 361/45 |
| 5,434,509 | 7/1995 | Blades | 324/536 |
| 5,444,424 | 8/1995 | Wong et al. | 335/172 |
| 5,446,431 | 8/1995 | Leach et al. | 335/18 |
| 5,448,443 | 9/1995 | Muelleman | 361/111 |
| 5,452,223 | 9/1995 | Zuercher et al. | 364/483 |
| 5,459,630 | 10/1995 | MacKenzie et al. | 361/45 |
| 5,477,150 | 12/1995 | Ham, Jr. et al. | 324/536 |
| 5,481,235 | 1/1996 | Heise et al. | 335/18 |
| 5,483,211 | 1/1996 | Carrodus et al. | 335/18 |
| 5,485,093 | 1/1996 | Russell et al. | 324/522 |
| 5,493,278 | 2/1996 | MacKenzie et al. | 340/638 |
| 5,506,789 | 4/1996 | Russell et al. | 364/492 |
| 5,510,946 | 4/1996 | Franklin | 361/56 |
| 5,512,832 | 4/1996 | Russell et al. | 324/522 |
| 5,519,561 | 5/1996 | Mrenna et al. | 361/105 |
| 5,531,617 | 7/1996 | Marks | 439/723 |
| 5,546,266 | 8/1996 | Mackenzie et al. | 361/93 |
| 5,561,605 | 10/1996 | Zuercher et al. | 364/483 |
| 5,568,371 | 10/1996 | Pitel et al. | 363/39 |
| 5,578,931 | 11/1996 | Russell et al. | 324/536 |
| 5,590,012 | 12/1996 | Dollar | 361/113 |
| 5,602,709 | 2/1997 | Al-Dabbagh | 361/85 |
| 5,608,328 | 3/1997 | Sanderson | 324/529 |
| 5,657,244 | 8/1997 | Seitz | 364/492 |
| 5,659,453 | 8/1997 | Russell et al. | 361/93 |
| 5,682,101 | 10/1997 | Brooks et al. | 324/536 |
| 5,691,869 | 11/1997 | Engel et al. | 361/42 |
| 5,701,110 | 12/1997 | Scheel et al. | 335/132 |
| 5,706,154 | 1/1998 | Seymour | 361/42 |
| 5,726,577 | 3/1998 | Engel et al. | 324/536 |
| 5,729,145 | 3/1998 | Blades | 324/536 |
| 5,805,397 | 9/1998 | MacKenzie | 361/42 |
| 5,805,398 | 9/1998 | Rae | 361/42 |
| 5,815,352 | 9/1998 | Mackenzie | 361/42 |
| 5,818,237 | 10/1998 | Zuercher et al. | 324/536 |
| 5,818,671 | 10/1998 | Seymour et al. | 361/42 |
| 5,835,319 | 11/1998 | Welles, II et al. | 361/5 |
| 5,835,321 | 11/1998 | Elms et al. | 361/45 |

ZONE ARC FAULT DETECTION

FIELD OF THE INVENTION

The present invention relates to the protection of electrical circuits and, more particularly, to the detection of electrical faults in an electrical circuit, and more particularly still to the detection of arc faults in individual zones of electrical circuits.

BACKGROUND OF THE INVENTION

The electrical systems in residential, commercial and industrial applications usually include a panelboard for receiving electrical power from a utility source. The power is then routed through protection devices to designated branch circuits supplying one or more loads. These protection devices are typically circuit interrupters such as circuit breakers and fuses which are designed to interrupt the electrical current if predetermined limits of the conductors are surpassed or if other predefined fault conditions are detected on one of the protected lines or branches. Interruption of the circuit reduces the risk of injury or the potential of property damage from a resulting fire.

Circuit breakers are a preferred type of circuit interrupter because a resetting mechanism allows their reuse. Typically, circuit breakers interrupt an electric circuit due to a disconnect or trip condition such as a current overload or ground fault. The current overload condition results when a current exceeds the continuous rating of the breaker for a time interval determined by the trip current. The ground fault trip condition is created by an imbalance of currents flowing between a line conductor and a neutral conductor such as a grounded conductor, something causing a current path to ground, or an arcing fault to ground.

Arcing faults are commonly defined as current through ionized gas between two ends of a broken conductor or at a faulty contact or connector, between two conductors supplying a load, or between a conductor and ground. However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, contacts, connectors or insulation, loose connections, wiring damaged by nails or staples through the insulation, and electrical stress caused by repeated overloading, lightning strikes, etc. These faults may damage the conductor insulation and reach an unacceptable temperature. Arcing faults can cause fire if combustible materials are in close proximity.

There are also many conditions that may cause a "false" arcing fault. For example, the occurrence of an arcing fault event in one branch circuit of an electrical distribution system may cause a false arcing fault signal in another branch circuit as a series path is created between the branch circuits through a load center. As a result, circuit interrupters in more than one branch circuit are tripped. Another example is a noisy load such as arc welder, electric drill, etc. producing a high frequency disturbance in the electrical circuit which appears to be an arcing fault.

In general, a "zone" refers to any length of power wiring which is bounded by some definable end of zone device such as a current sensor, a line-to-ground voltage sensor, or a lug between conductors of the same phase. Generally speaking, arc faults are of two types, series arcs and parallel arcs. Series arcs are unintended interruptions in the normal current path such as broken wires, loose terminations or contacts with low contact force. Parallel arcs generally involve conduction through an insulating path between conductors of different voltages. These parallel arcs may be line-to-ground arcs (ground faults) or line-to-line arcs (phase-faults). Generally speaking, the current through a series arc is usually limited by the load impedance while the current through a parallel arc is controlled by the line impedance and the arc voltage.

Prior art arc detection systems leave room for improvement in a number of areas. Some prior art series arc detection devices have relied on noise detection in the load current to detect an arc. Generally speaking, the noise signatures of arcs are broadband current fluctuations which vary in amplitude and frequency content depending on the load type. Many loads also broadcast electrical noise due to electronic power switching components, brush-type motors or other generally "noisy" loads. Some prior art devices have difficulty in distinguishing load noise from arc noise.

Secondly, many arcs begin as a series arc in a failing connection, but are not detected by some prior art detectors until more serious line-to-ground or line-to-line arcs have occurred. That is, some prior art detection methods and devices do not detect a series arc substantially immediately when it is formed.

Thirdly, in line-to-line arc faults, the current is sometimes limited by the arc voltage or line impedance as noted above. Thus, line-to-line faults may not typically be detected by the instantaneous current (magnetic trip) setting of a circuit breaker or the $I^2t$ time characteristic of a fuse. Moreover, some arcs are sputtering arcs with reduced $I^2t$ which also slows over current detection by breakers and fuses. Thus, it is difficult with some prior art methods and devices to promptly detect faults of this type.

Fourthly, some prior art methods and devices use algorithms which require some time in which to accomplish signal processing, such as detecting the difference between the present waveform and a reference or time delayed image of the waveform. Such methods may include calculating average load impedances at different frequencies for use in the algorithm. The algorithm must then determine if any observed changes are due to arcs or due to fluctuating load conditions. Since loads may turn on and off and have unpredictable characteristics, arc detection with these methods typically takes some amount of time and is not substantially instantaneous or immediate upon the occurrence of an arc fault. This type of detection can therefore result in nuisance trips, i.e. tripping a circuit breaker due to a fluctuating load condition which is improperly identified as an arc fault, while also potentially missing some arc faults.

OBJECTS AND SUMMARY OF THE INVENTION

It is a general object of the present invention to provide an arc fault detection system and method which reliably detects arc faults.

A related object is to provide an arc fault detection system and method which detects both series and parallel arcs in each protection zone of a wiring system without regard to the nature of the arc fault waveform or the direction of the load current in the circuit.

Yet another object is to provide an arc fault detection system which is not affected by noise content in the load or from outside sources.

A further object of the invention is to provide an arc fault detection system and method which substantially instantaneously detects a series arc.

Yet another object of the invention is to provide an arc fault detection system and method which detects line-to-line faults substantially at the moment fault current begins, regardless of the fault voltage signature.

Yet a further object of the invention is to provide an arc fault detection system and method which does not require historical information about the loads or waveforms and is insensitive to changes in load conditions or load current waveforms.

A related object of the invention is to provide an arc fault detection system which substantially overcomes the above-noted problems in some prior art methods and devices.

In accordance with one aspect of the invention, there is provided a zone arc fault detector comprising voltage summing means for summing the voltages of all phases of said circuit at both source and load ends of said zone; and comparing means for comparing the sum of the voltages at one of said load and source ends of each phase and the sum of the voltage that the other said load and source ends of each phase and for producing a difference signal corresponding to any difference therebetween.

In accordance with another aspect of the invention, a zone arc fault detection system for detecting arcing faults in a defined zone of an electrical circuit, comprises a differential phase current detector including a pair of substantially identical parallel insulated conductors for each zone of each phase to be protected by said differential phase current detector thereby defining a protected zone comprising the length of said parallel conductors between two points where the two conductors are coupled together, a transformer current sensor inductively coupled with each said pair of parallel conductors, said transformer current sensor and said conductors being respectively configured and arranged such that the current induced in said current transformer sensor from one of said conductors is subtracted from the current induced in said current transformer sensor from the other said conductors to produce a difference current output.

In accordance with another aspect of the invention, a zone arc fault detector system comprises a differential current arc detector for detecting line-to-line and ground fault arcing conditions; and a differential voltage arc detector for detecting series arching faults.

In accordance with another aspect of the invention, a zone arc detector system comprises a differential current arc detector for detecting line-to-line and ground fault arcing conditions; and a differential phase current for detecting both series and parallel arcing faults.

In accordance with another aspect of the invention, a zone arc fault detection system for detecting arc faults in a defined zone of electrical circuit, comprises voltage sensing means for sensing the voltage in a line conductor of said electrical circuit at both source and load ends of said zone; and arc detector means coupled with said sensing means for producing a difference signal corresponding to any differences between the voltages at the source and load ends of said zone.

In accordance with another aspect of the invention, a zone arc fault detection system for detecting arc faults in a defined zone of an electrical circuit, comprises a current transformer operatively coupled with a line conductor of said electrical circuit for producing a current signal corresponding to an electrical current inside line conductor; an arc detector coupled with said current transformer for detecting a change in current due to a series arcing fault on said line conductor; and a line impedance stabilization network coupled with the source and line ends within the defined zone of said line conductor.

In accordance with another aspect of the invention, a zone arc fault detection system for detecting arc faults in a defined zone of electrical circuit, comprises voltage sensing means coupled with each of source and load ends within a zone of a line conductor of said electrical circuit; a current sensor coupled with said line conductor of said electrical circuit adjacent the source end of said zone; and an arc power sensor operatively coupled with said voltage sensors and with said current sensors for measuring power loss through the line conductor in said zone corresponding to a series arc in said line within said zone.

In accordance with another aspect of the invention, a zone arc fault detection system for detecting arc faults in a defined zone of an electrical circuit, comprises voltage summing means for summing the voltages of all phases of said circuit at both source and load ends of said zone; comparing means for comparing the sum of the voltages at one of said load and source ends of each phase and the sum of the voltage that the other said load and source ends of each phase and for producing a difference signal corresponding to any difference therebetween; a differential current arc detector; and ground fault sensor means comprising a current transformer sensor operatively coupled with line and neutral conductors of said electrical circuit for detecting a difference in current therebetween in producing a corresponding difference signal.

In accordance with another aspect of the invention, a system for monitoring for arcing faults in a joint of an electrical circuit comprises including means for monitoring for a voltage differential across said joint and means for producing a corresponding arcing fault signal.

DESCRIPTION OF ILLUSTRATIVE EMBODIMENTS

Figure 1:
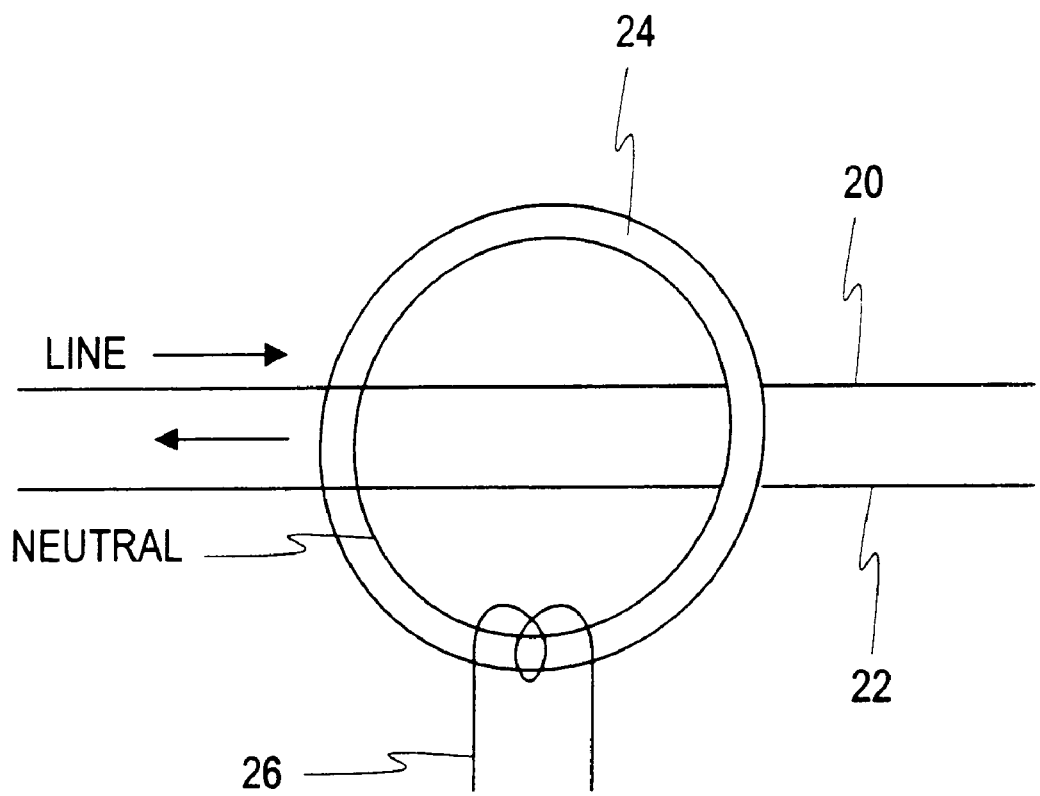
FIG. 1 is a simplified circuit schematic showing a ground fault detector which may be used for detecting arcs to ground in accordance with one aspect of the invention.

While the invention may be susceptible to various modifications and alternative forms, specific embodiments thereof have been shown by way of example in the drawings and will herein be described in detail. It should be understood, however, that it is not intended to limit the invention to the particular forms disclosed but on the contrary, the intention is to cover all modifications, equivalent and alternatives falling within the spirit and scope of the invention as defined by the appended claims. Several different aspects of the invention, each with its own unique features and alternative embodiments, are described. Permutations and combinations of these features may lead to yet further embodiments.

Referring now to the drawings and initially to FIG. 1, a ground fault or zero-sequence differential current sensing arrangement in an AC electrical circuit is illustrated. For simplicity, a single phase circuit including a line conductor 20 and a neutral conductor 22 is shown in FIG. 1. A current transformer type of sensing coil 24 generally comprises a toroidal coil through which both the line and neutral conductors pass. The toroidal coil 24 may be wound helically on a core made of magnetic material, such ground fault sensors or transformers being generally known in the art. Since the current flow or direction in the line and neutral conductors should be opposite and equal in the absence of any ground faults in the circuit, an output coil 26 wound about the toroidal coil 24 should produce essentially zero current unless a ground fault occurs. The impedance from the conductors to ground is usually relatively high and some stray capacitance in the conductors or in the load (not shown) may account for some small error current. While the ground fault sensor will produce a detectable current output at its output coil 26 in response to a line-to-ground fault, it will not produce a useable current in response to line-to-line faults, for example, between the lines of a multiple phase circuit. Also, the ground fault sensor configuration of FIG. 1 does not detect series arcing.

Figure 2:
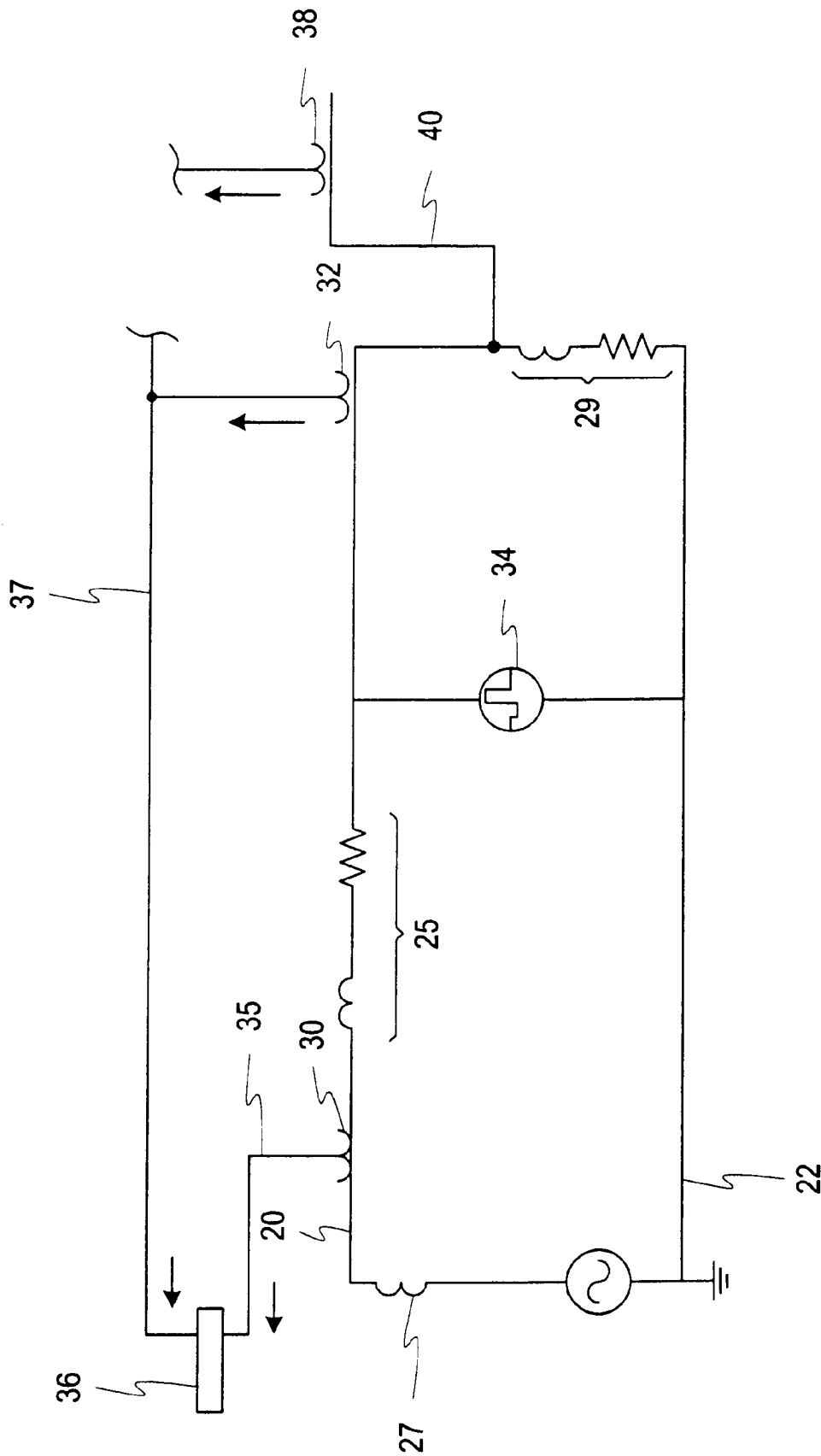
FIG. 2 is a circuit schematic of a differential current shunt arc detection system.

Referring to FIG. 2, a simplified apparatus for differential current shunt arc detection is shown. A shunt arcing fault current is schematically indicated at 34. This apparatus and the method by which it operates rely upon the principal that the current entering and leaving the intended connection points of a wire will sum to zero except during a line-to-line or line-to-ground fault. A source 23, line impedance 25, source impedance 27, and load impedance 29 are schematically indicated. In the illustrative embodiment, the line conductor 20 passes through current transformer (CT) sensors and 32 at the source and load ends or boundaries of a given zone. Preferably each of the CT's 30, 32 comprises a toroidal coil which the line conductor passes through. Connecting wires or "pilot wires" 35, 37 from the current transformer sensors 30 and 32 are directed such that their current flow is to either end of a current summing arc detector 36 which will sum these two currents (which flow in opposite directions such that a "current differential" is detected). In the absence of a shunt arc such as the arc 34, the currents should be equal such that the net output of the current differential sensor 36 will be zero. The arc detector 36 may also include means for avoiding response to "noise" signals, such as requiring that the magnitude of the current differential, i.e., the summed currents, exceed some preselected threshold value before producing an output or "trip" signal. Such an output or trip signal may be used to trip a circuit breaker (not shown) or other circuit interruption device and/or to produce a human perceptible indication of the existence of an arc fault.

It should be noted that if the line conductor is tapped, each tap in the line conductor 20 will be provided with an additional current transformer sensor such as the sensors 30 and 32. Thus, in FIG. 2, for example, if there is another load at the end of a first tap 40 in the line conductor 20, then a further similar current transformer 38 would be provided at the tap 40 to feed the current differential sensor 36 together with the current transformers 30 and 32. The apparatus and associated method described with reference to FIG. 2 does not detect a series arc within the zone. Also, FIG. 2 illustrates a simple single phase line, such that in a three-phase circuit with a neutral conductor, the zone would employ a total of eight current transformers, four each at the source end and at the load end of the zone.

Figure 3:
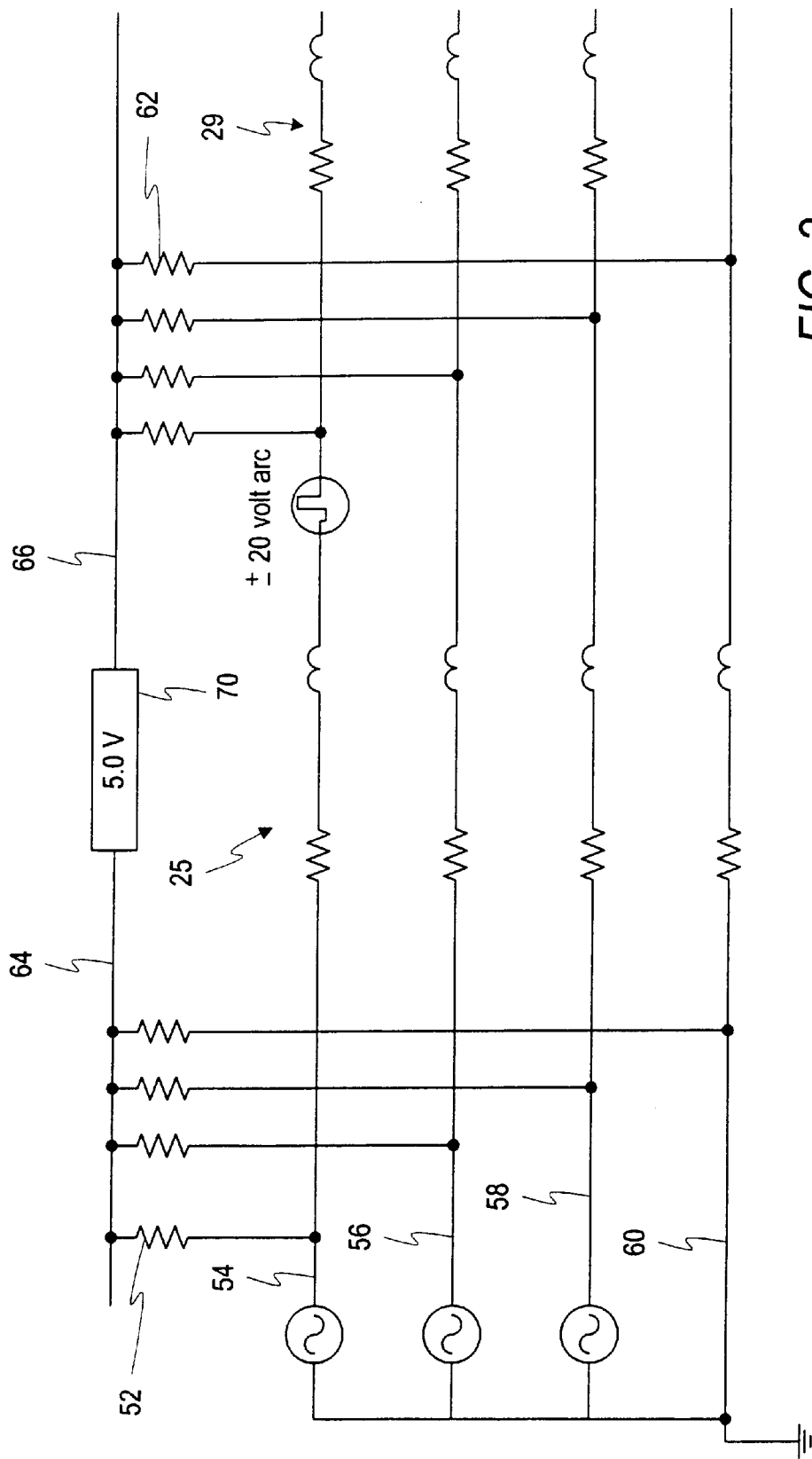
FIG. 3 is a circuit schematic of a zero-sequence voltage differential arc detection system.

Referring next to FIG. 3, a circuit for a zero-sequence voltage differential method for series arc detection is shown. This method of series arc detection recognizes three principals: 1) the line-to-ground voltage at each point of a wire in a zone between a source and a load is the same except for any voltage drop due to the load current through the series line impedance and any induced voltage is due to inductive coupling between individual conductors of the circuit. 2) The currents in the phase conductors will sum to zero anywhere in the zone. It can be shown that the voltage drops and mutually induced voltages also sum to zero for wiring systems with similarly shaped phase conductors. 3) The current-carrying conductors have similar electrical properties and similar mutual couplings between all phase conductors.

In the circuit 50 of FIG. 3, the voltages are summed at all the phases of the circuit at each of the source and load ends. A means for summing these voltages in the illustrative embodiment take the form of a plurality of matched resistors 52 which are coupled together at one end to a common line or pilot wire 64 and have their opposite ends coupled to the respective source ends of the respective phase lines 54, 56, 58 and the neutral line 60. A similar set of matched resistors 62 have first ends coupled together to a common line or pilot wire 66 and second ends coupled respectively to the load ends of the phase lines 54, 56, 58 and neutral line 60. The respective summed voltages which are obtained at the common ends of the two groups of matched resistors 52 and 62 may be referred to as a zero-sequence voltage. Preferably, matched, relatively high value resistors such as 200k ohms are used. However, matched capacitances may also be used to obtain the zero-sequence voltages of the phase conductors. This arrangement is such that the voltage on the respective pilot wires 64, 66 represent an average of the phase conductor voltages at that point, also known as the zero-sequence voltage. In order to avoid mutually coupled noise sources, it is preferred to direct the respective lines or pilot wires 64 and 66 in a common path with the phase conductors back to an arc detector 70. This eliminates a one-turn loop between the pilot wire and the phase conductors which can pick up magnetic field fluctuations and low frequency radio waves.

The arc detector 70 comprises comparing means for comparing the two zero-sequence voltages, that is, the respective sums of the voltages on the pilot wires from the load end and source end of the line. Under normal conditions, this zero-sequence voltage arc detector or comparing circuit 70 will produce a difference signal corresponding to any difference between the two zero-sequence voltages at pilot wires 64 and 66. If there are no series arcing faults in the monitored phase lines, the difference should ideally be zero. A difference of a few volts implies an arc voltage or an error due to unbalanced wire impedances. The resulting detector signal is defined as a difference between the sum of the voltages at the source end of the zone and the sum of the voltages at the load end of the zone.

When a series arc fault occurs in one of the phase conductors, a series voltage will appear in that phase conductor which is not matched in the other phase conductors. Thus the corresponding pilot wire 64 or 66 will pick up a voltage which can be shown to be equal to the arc voltage divided by the number of end of zone impedances, i.e., the resistors 52 or 62. That is, on the illustrated three-conductor plus neutral circuit, an arc voltage appearing as a 15 to 20 volt square wave with random time lengths will cause a zero-sequence voltage to be sensed downstream from the fault point, inducing for example, a 20/4 or 5 volt square wave on the corresponding pilot wire 64 or 66 (or, in a three-phase system without a voltage pickup on the neutral, 15/3=5 volt). The arc detector 70 will then detect this 5 volt square wave potential difference between the source point zero-sequence sensors 52 and the end of zone sensors 62 at the respective pilot wires 64 and 66. This will produce a non-zero difference signal indicating an arc fault. Generally speaking, arcing will not occur below a minimum voltage of about 11–12 volts, and, as a practical matter usually does not occur below about 15–20 volts.

A small noise signal may occur due to differences in impedance between the load current wires and/or due to unbalanced pilot wire mutual inductance and capacitance to the phase conductors. Thus, the arc fault detector 70 may also include means for avoiding response to such noise signals, such as requiring that the magnitude of a difference signal or difference between the zero sum voltages at wires 64 and 66 be above some predetermined minimum or threshold value before producing an output or trip signal. This output or trip signal may be used to trip a circuit breaker (not shown) or other circuit interruption device, and/or to produce a human perceptible indication of the existence of an arc fault in the zone being monitored. It will be noted that in the case of a three-phase system, the matched impedances or resistors 52 and 62 comprise wye-connected matched resistors.

In one practical application, a trip curve for the circuit of FIG. 3 might include a threshold level of approximately 5 volts and an inverse time trip characteristic. However, if switching devices are in the protected zone, additional trip control means would be provided in the arc detector 70 responsive to the opening of any switch device in the zone for disabling the trip signal. Otherwise, the trip control means of the arc detector 70 would normally enable the trip signal. While the circuit of FIG. 3 detects primarily series arcs, the presence of a ground fault in the zone will also generate some zero-sequence differential signal, because the increased current in the ground fault in a phase conductor will cause a greater voltage drop on that phase conductor which is not matched in the other phase conductors. Even if all phase conductors had ground faults, it is unlikely that they would all result in equal voltage drops. However, phase-to-phase or shunt arcs will not generate a zero-sequence differential signal. Accordingly, the circuit of FIG. 3 for series arc detection might be used in combination with the circuit of FIG. 2 for shunt arc detection to provide an arc detection system capable of detecting both types of arcs.

Furthermore, the arc detector 70 may include means for compensating for systems wherein the neutral conductor has a much higher impedance or shares large currents from other branches. If the respective phase conductors are tapped within the zone by branch circuits, the additional zero-sequence sensors (i.e., additional impedances such as the matched resistors 52 or 62 running back to the common lines or pilot wires) may be placed at all of the desired boundary points or at any intermediate connection point for additional accuracy in pin-pointing the positioning of the arcing fault. However, added sensors are not required for loads which tap power within the zone as was true with the differential current method as described above.

The ground fault detector of FIG. 1 might also be combined with either, or both, of the shunt and series arc detection circuits of FIGS. 2 and 3 for combined arcing and ground fault protection in a wiring system, or in specific zones of a wiring system. In such a combined protection system, the ground fault sensor would generally be responsive to ground faults throughout a wiring system without respect to zones, while the respective zone arc fault detection circuits of FIGS. 2 and 3 would be employed in those zones where such protection is desired.

Figure 4:
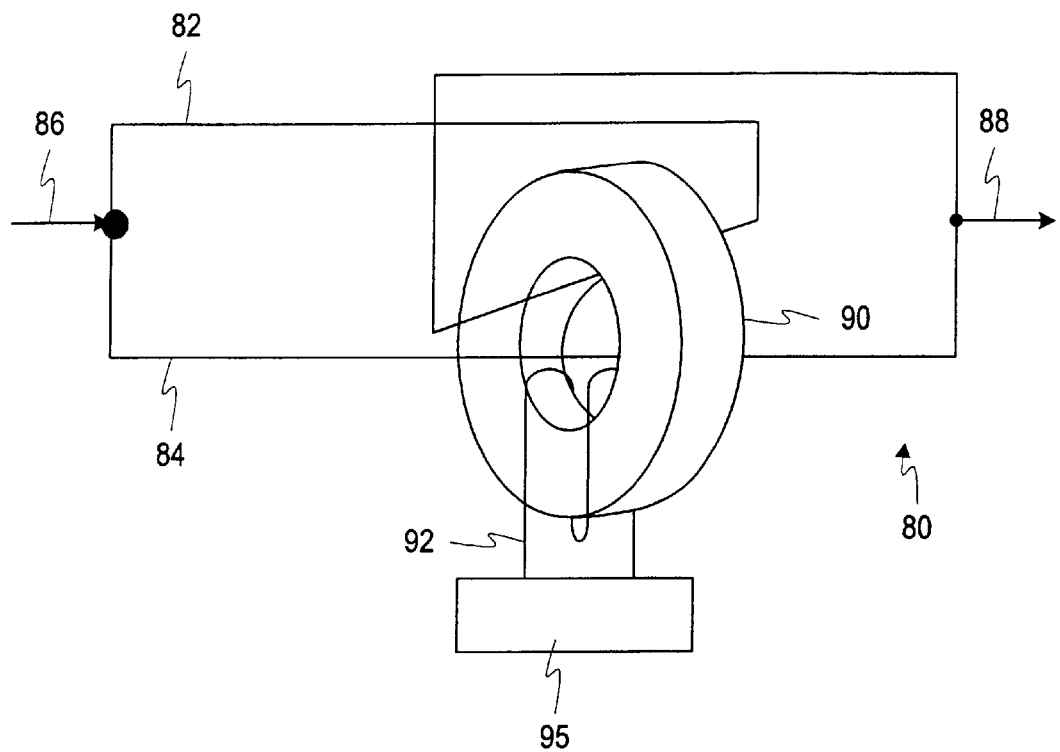
FIG. 4 is a simplified circuit schematic illustrating differential phase current arc detection.

Referring now to FIG. 4, a circuit for differential phase current arc detection is illustrated, and designated generally by the reference numeral 80. This method requires that each phase conductor, in the zone thereof to be protected, will consist of a pair of identical parallel insulated conductors, for example, conductors 82, 84 as shown in FIG. 4. However, no pilot wires are required for this method. Thus, the protected zone is defined as the extent or length of the conductors 82 and 84 between respective points where they are again joined to a single conductor, for example, respective input and output points 86, 88, in the example shown in FIG. 4.

The two conductors 82 and 84 are arranged to pass through a magnetic core 90 in such a way that the current on the two conductors 82 and 84 travel in opposite directions through the core 90. The core 90 is provided with a coil 92 on which an output signal is developed which corresponds to any difference in the current between the two conductors 82 and 84. Since identical parallel insulated conductors are used, the output of the coil 92 should be essentially zero in the absence of any arcing faults in the zone. However, any series arc in the connections of one of the conductors of the zone will create or generate a circulating current which will pass through the source tie point, that is, the point at which the wires 82, 84 are coupled to the source end or input wire 86, and also through the arc sensing detection core 90. This circulating current will be detected and a fault will be sensed as the result of an output current on the output coil 92. Line-to-line or line-to-ground faults will generate relatively large fault currents which are sensed directly by the arc detecting magnetic core 90. As with the above-described embodiments, an arc detector 95 may be coupled with the output coil 92 and this arc detector 95 may respond to any current in the output coil 92 for producing a trip signal in the event this current exceeds some predetermined threshold value.

This method can also be used for active impedance sensing of the wiring integrity with the wiring either energized or de-energized. An AC signal applied to the coil 92 of the magnetic core 90 can be used to interrogate the total circulating impedance of the phase conductors. An open conductor or unusual increase in resistance will be detected as a corresponding change in the AC signal at the coil 92.

Referring also to FIGS. 5–10, a number of different equivalent versions of the circuit for differential phase current detection shown in FIG. 4 can be implemented. It will be recognized that other implementations may be possible using the principals discussed hereinabove and illustrated in FIG. 4, the illustrated specific embodiments being by way of example only.

Figure 5:
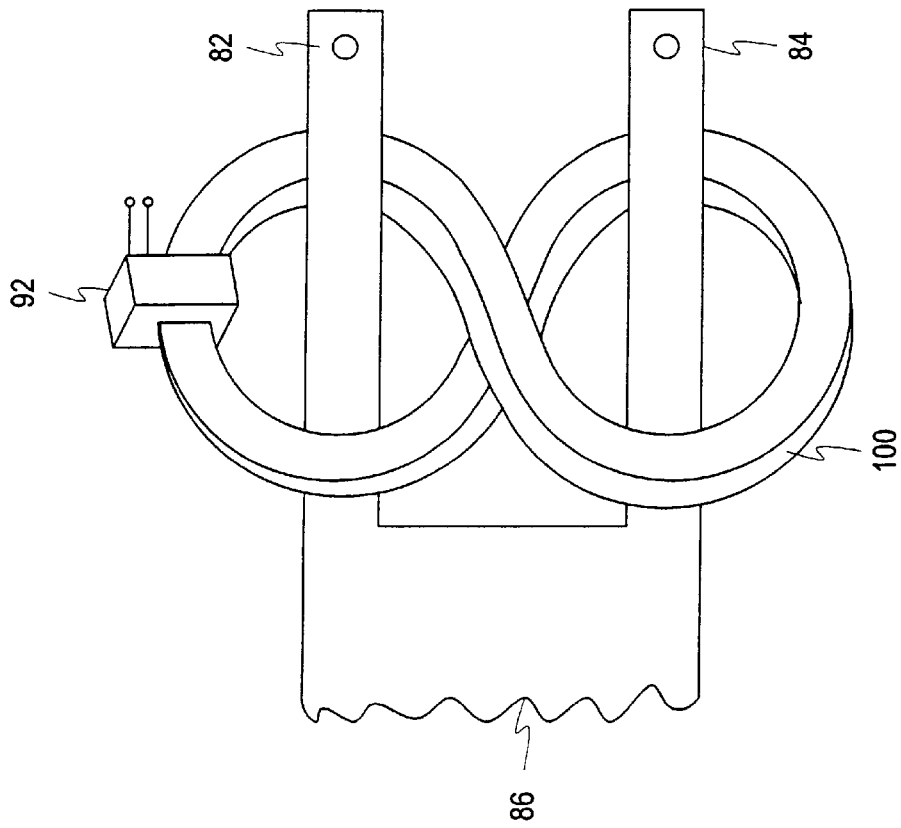
FIG. 5 shows an alternative form of differential phase current detection functionally equivalent to FIG. 4.
Figure 8:
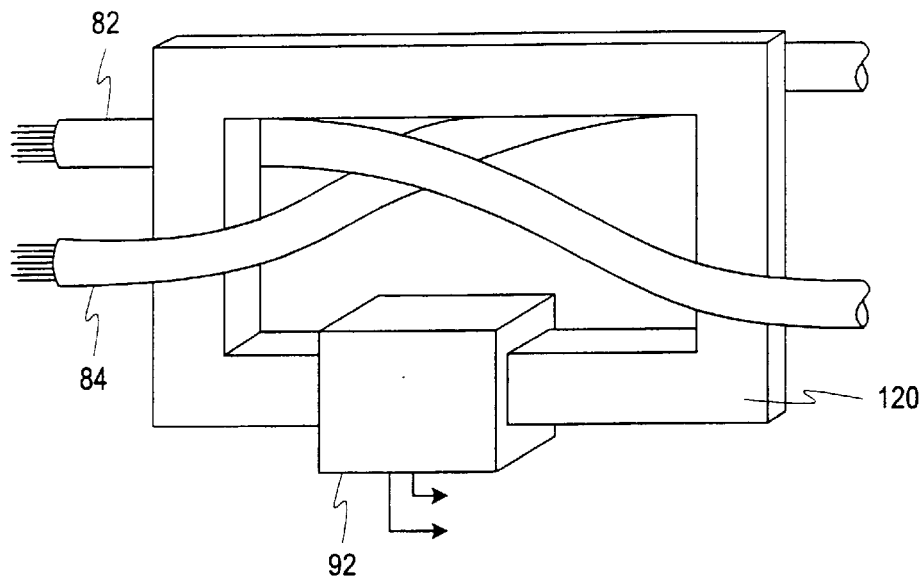
FIGS. 8, 9 and 10 show yet further variations in apparatus for differential phase current detection which are functionally equivalent to those illustrated in the previous FIGS. 4–7.

For example, in FIG. 5, the two conductors 82 and 84 of the phase pass through the respective loops of a figure 8-shaped core 100 which is provided with a similar sensing coil 92. It should be noted that the point at which the core segments cross in the figure 8 are not touching in this embodiment.

Figure 6:
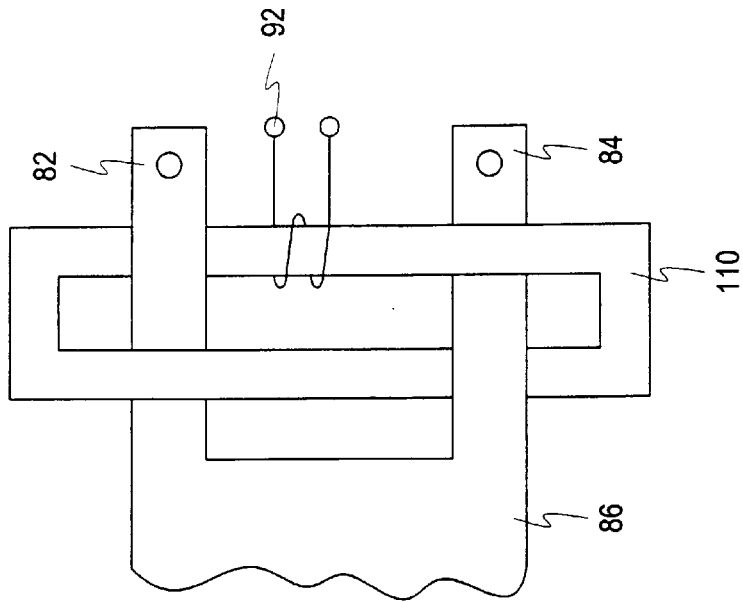
FIGS. 6 and 7 show yet another form of differential phase current detection, functionally equivalent to FIGS. 4 and 5.
Figure 7:
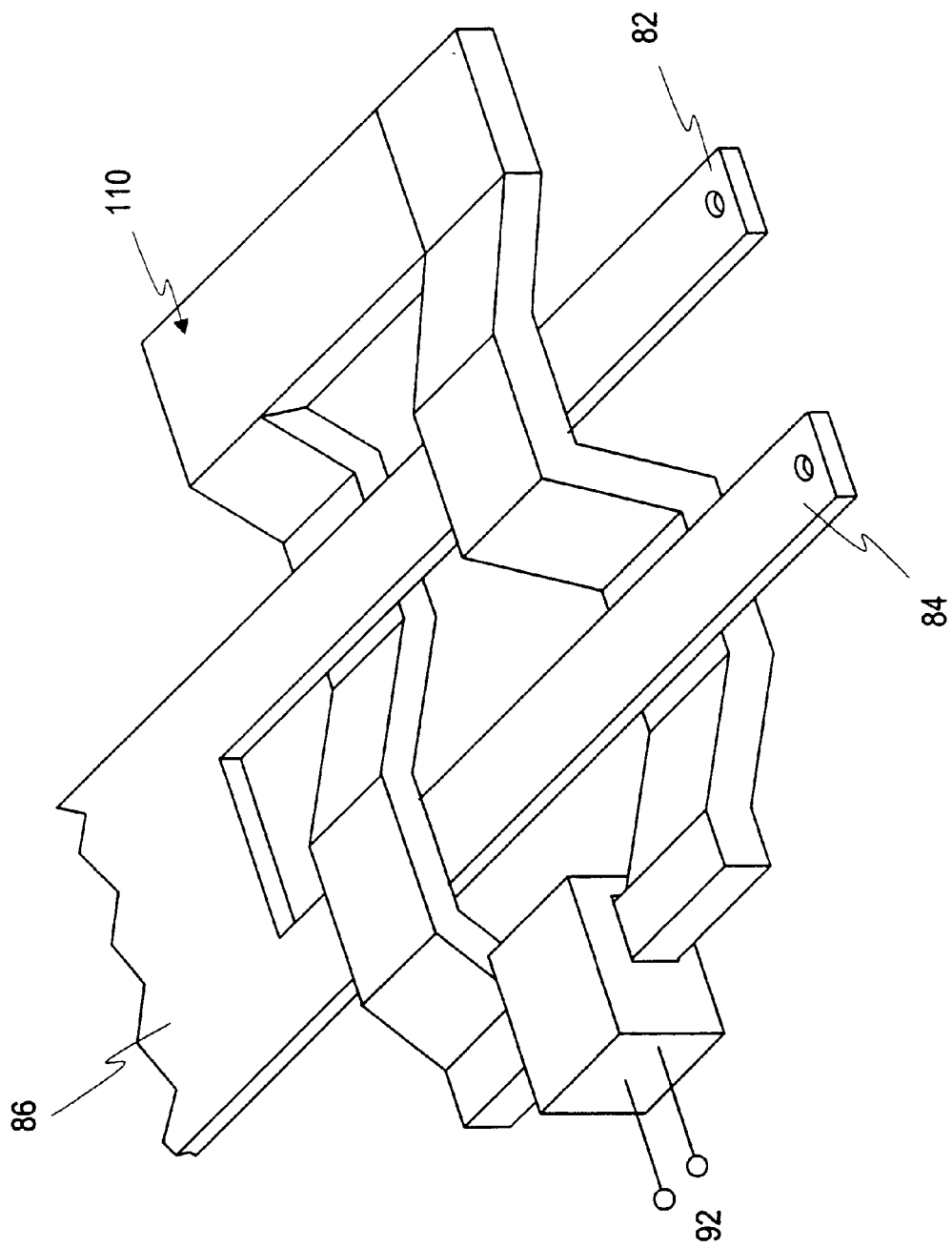
Figure 9:
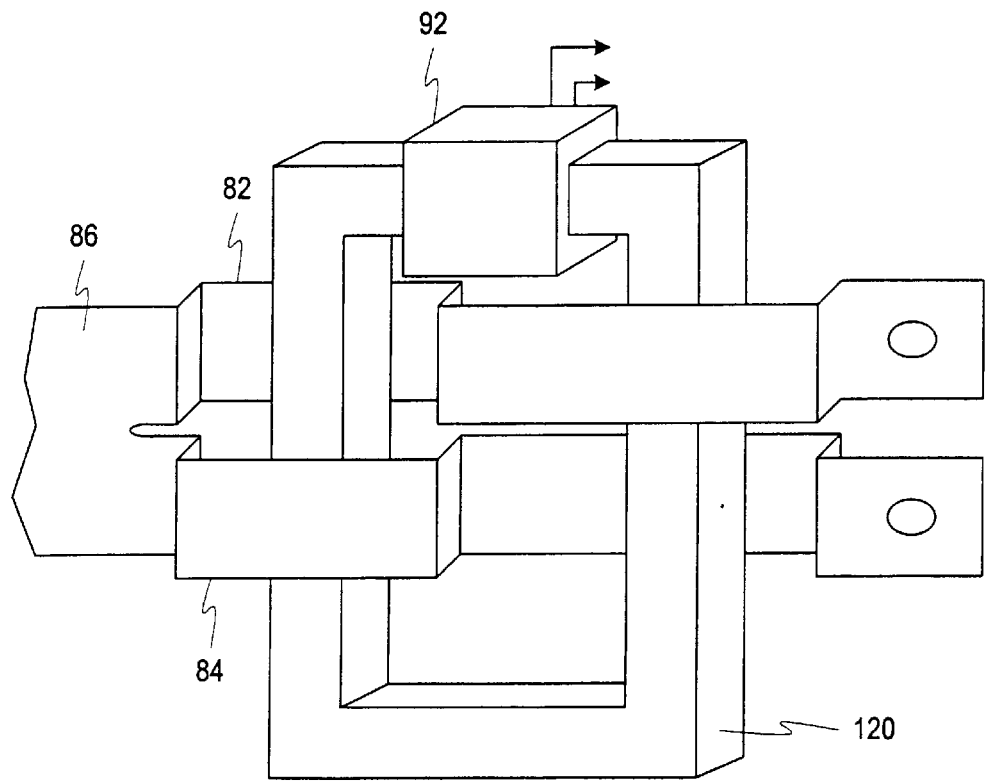
Figure 10:
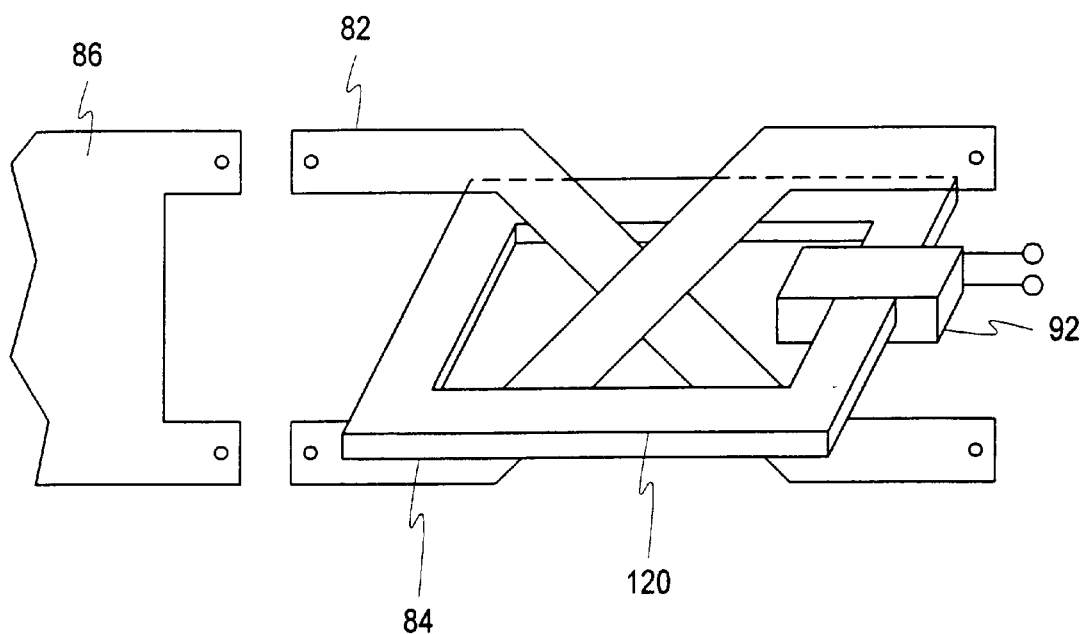

In FIG. 6, the two conductors 82 and 84 cross as they pass through respective top and bottom segments of a core 110 whose shape is also shown in FIG. 7. A similar output or sensing coil 92 is provided at a suitable point on the core 110. Additional schemes for crossing conductors of various types as they pass through a generally rectangular core 120 are shown in FIGS. 8–10.

Figure 11:
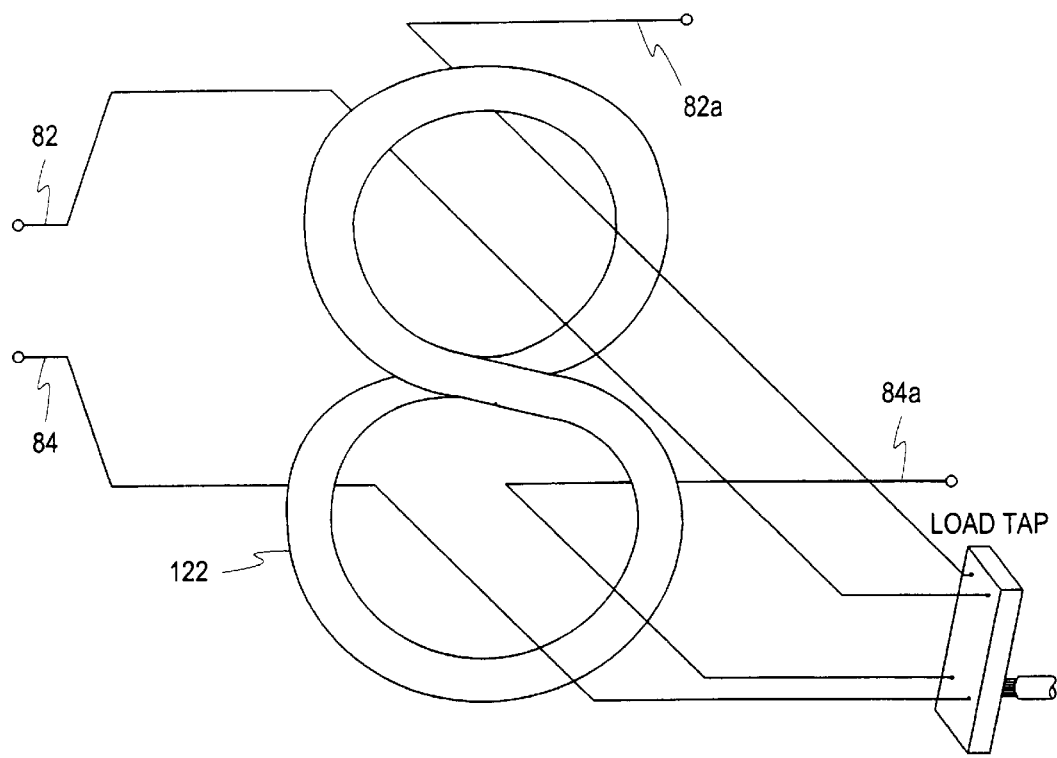
FIG. 11 and 12 show apparatus for accommodating taps in apparatus for differential phase current detection according to any of FIGS. 4–10.
Figure 12:
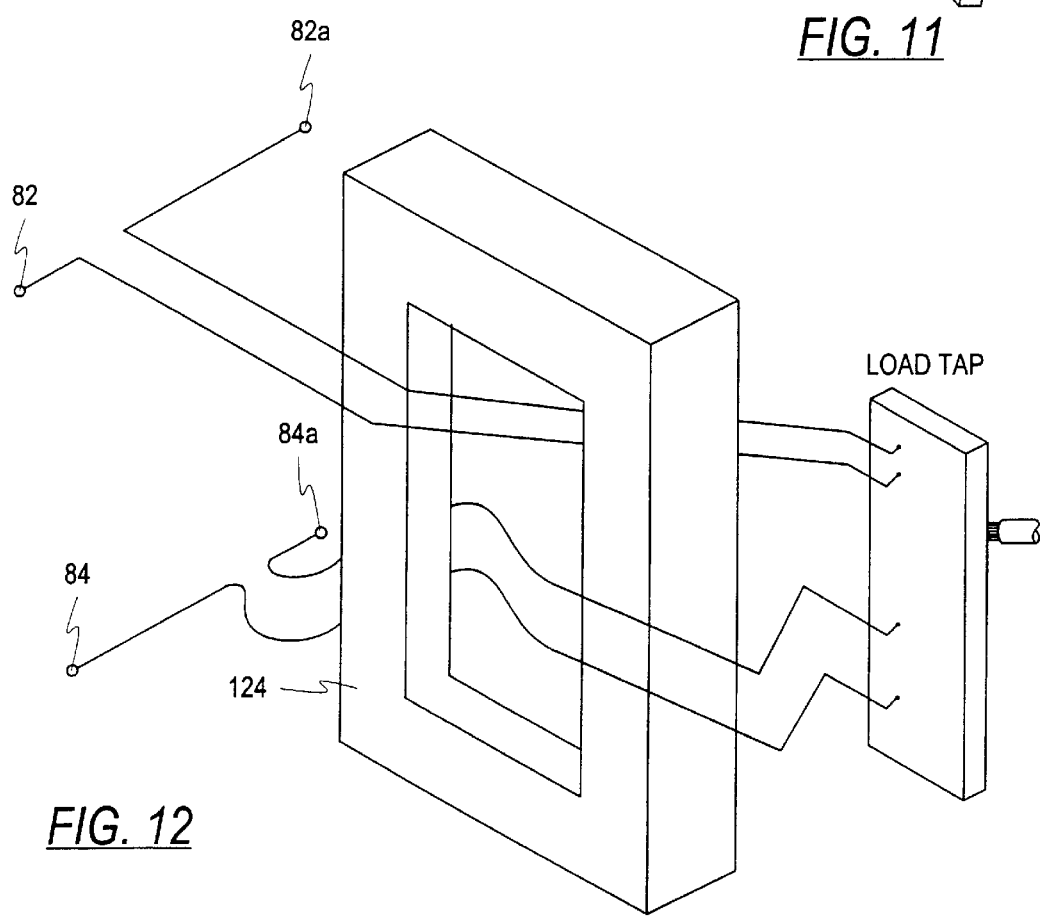

In the differential phase detection scheme described above, any power or load taps within the zone are also required to have an additional end-of-zone device, that is, an additional transformer core. Two schemes for providing such cores at power or load taps are illustrated respectively in FIGS. 11 and 12. In FIG. 11 a figure 8-shaped core 122, similar to that shown in FIG. 5 is used, while in FIG. 12, a generally rectangular core 124 similar to the core 120 of FIGS. 8–10 is used. Respective pairs of conductors 82, 84 enter into the tap through the respective cores 122, 124 and emerge from the tap as conductors 82A and 84A. These latter transformer cores 122 and 124 present significant impedance to circulating currents passing between the conductors of the pair, but are not provided with coils such as the coils 92 illustrated and described above with reference to FIGS. 4–10. Rather, the purpose of the cores 122, 124 is to maintain any differential circulating current due to an arc fault when the two conductors are joined at a tap point.

Figure 13:
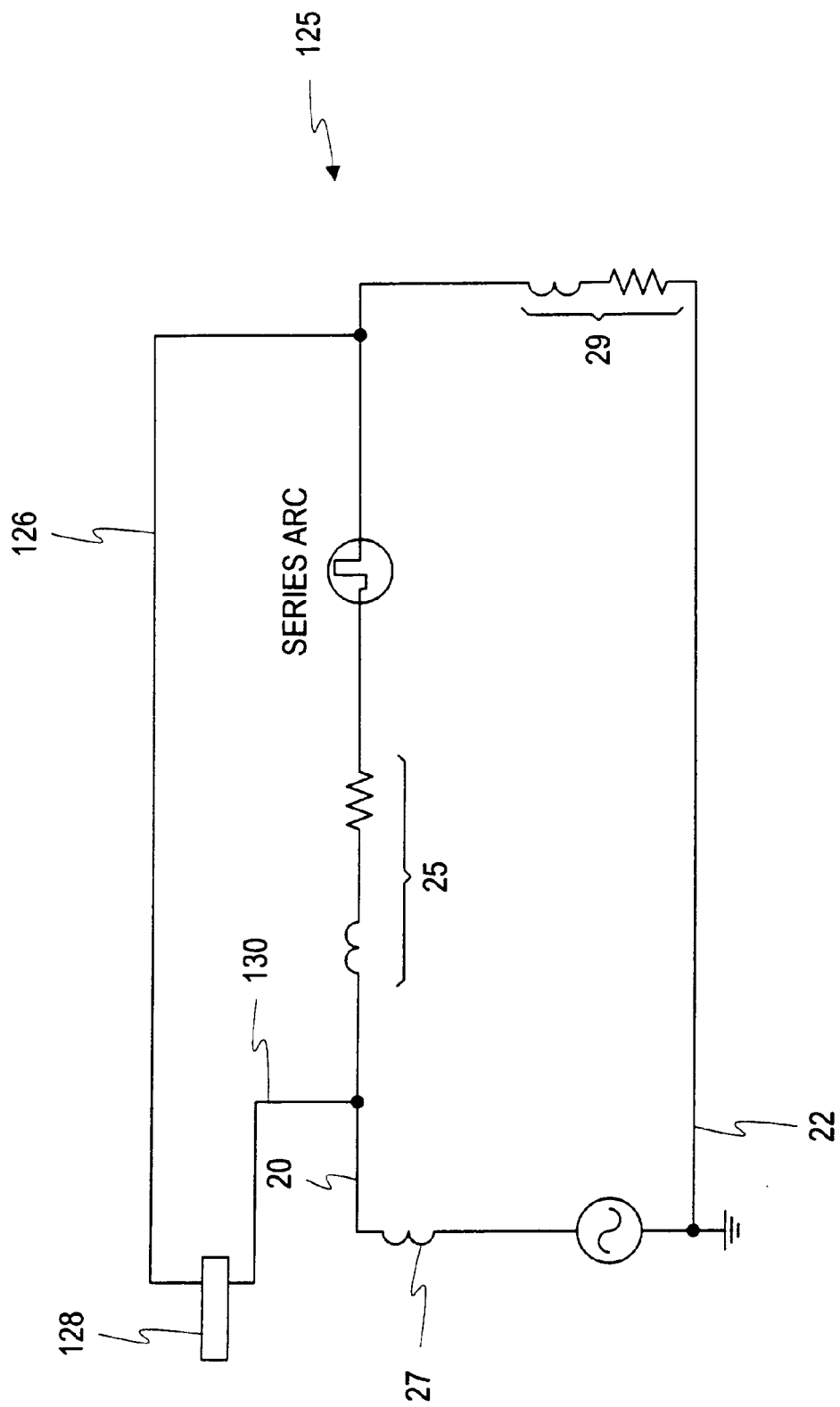
FIG. 13 is a circuit schematic of a simplified apparatus for voltage drop series arc detection.

Referring now to FIG. 13, a circuit 125 for voltage drop series arc detection as shown. This circuit detects the arc voltage itself, symbolized schematically in the circuit of FIG. 13 as $V_{ARC}$. It is noted that this circuit detects series arcs rather than shunt or parallel arcs. These arcs generate frequency components from DC to the megahertz range and beyond. The arc voltage always opposes the current in the line. The series arc voltage therefore always adds to the line voltage drop such that an unusual increase in voltage drop will indicate an arc in the conductive path. In the circuit of FIG. 13, a pilot wire 126 coupled near the load end of the zone feeds one input of an arc detector 128, which may be a voltage detector, for detecting or comparing the voltage on the pilot wire 126 with the voltage at or near the source end of the circuit which is fed to the detector 128 on a line 130. The total voltage drop seen by the detector 128 would then be the line voltage drop due to the nominal line impedance plus the arc voltage. The impedance voltage drop in the line must be subtracted from the total voltage drop at the detector 128 in order to extract the arc voltage. Impedance compensating methods might include a set of inductors and resistors in series with the detector 128 which mirror the line impedance, an equivalent software compensation algorithm. Monitoring the zero-sequence voltage as described above with reference to FIG. 3 avoids the need for line impedance compensation.

Figure 14:
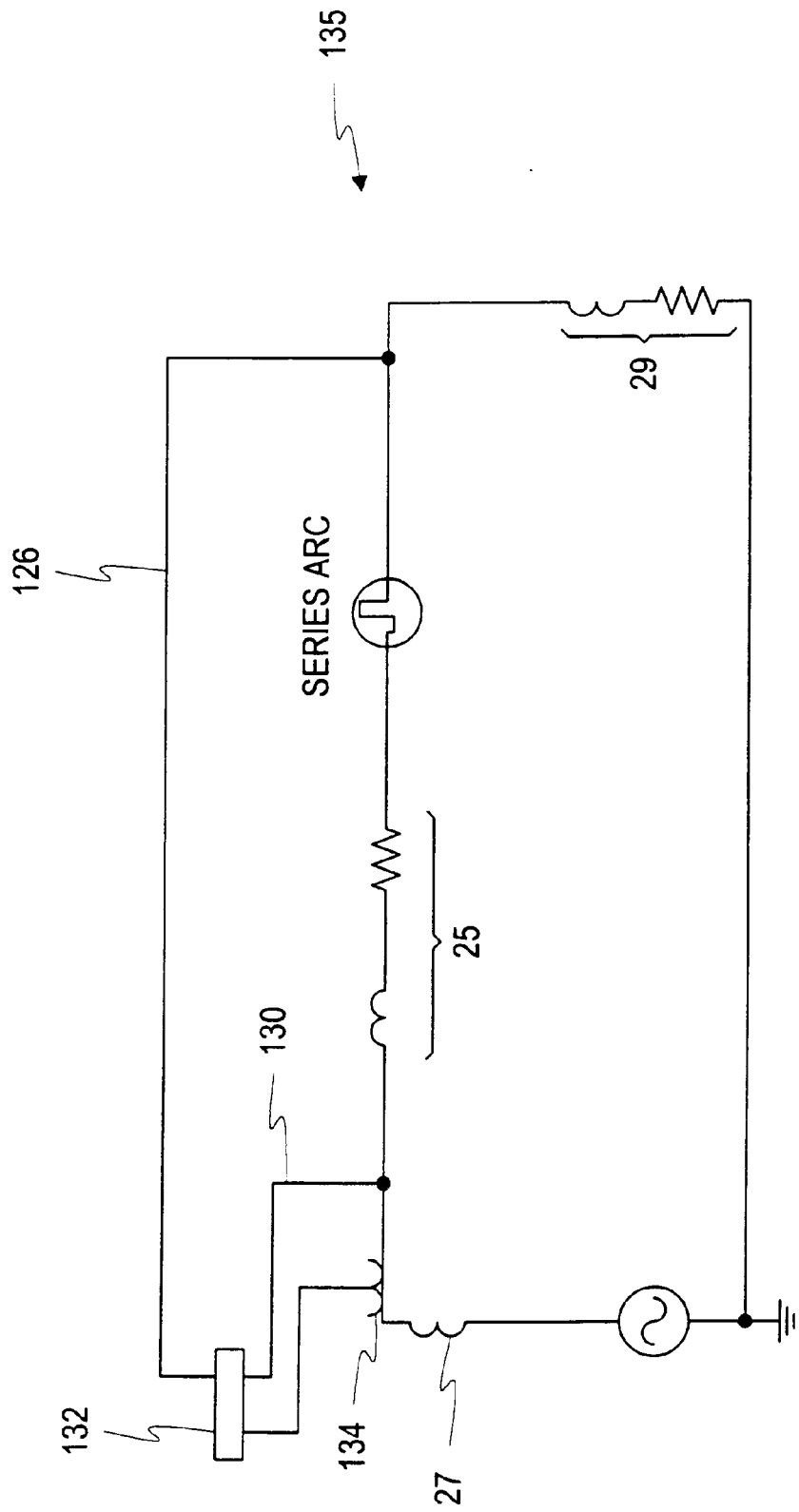
FIG. 14 is a simplified circuit schematic of a line power loss arc detection system.

Referring now to FIG. 14, a circuit 135 is shown for use in a line power loss (arc power) method of arc detection. This method monitors the power loss through a conductor and subtracts out the energy due to resistance. The arc power relates more directly to the potential for equipment damage and other problems, than do other measurements such as arc voltage or arc current alone. The same pilot wires or connections 126 and 130 as in the circuit of FIG. 13 supply the line drop voltage to an arc power sensor type of arc detector circuit 132. A current transformer sensor 134 supplies the current in the line from the source end of the line to the arc power sensor 132. Thus, the current times the total voltage drop may be calculated by the arc power sensor 132 to determine the arc power in the presence of an arcing voltage $V_{arc}$ as indicated in FIG. 14 in similar form to the arcing voltage indication as discussed above in FIG. 13. With this circuit 135 and approach, an inverse time trip curve could be utilized, allowing components such as breakers and fusers to have large operating arc power for a few milliseconds, while conductors and connections would be allowed little or no arc power.

As with the circuits of FIGS. 2 and 3, the arc detectors used in the circuits of FIGS. 13 and 14 could be provided with threshold limits, such that the voltage drop or power loss read at the detector must exceed some threshold value before a trip signal is produced.

Figure 15:
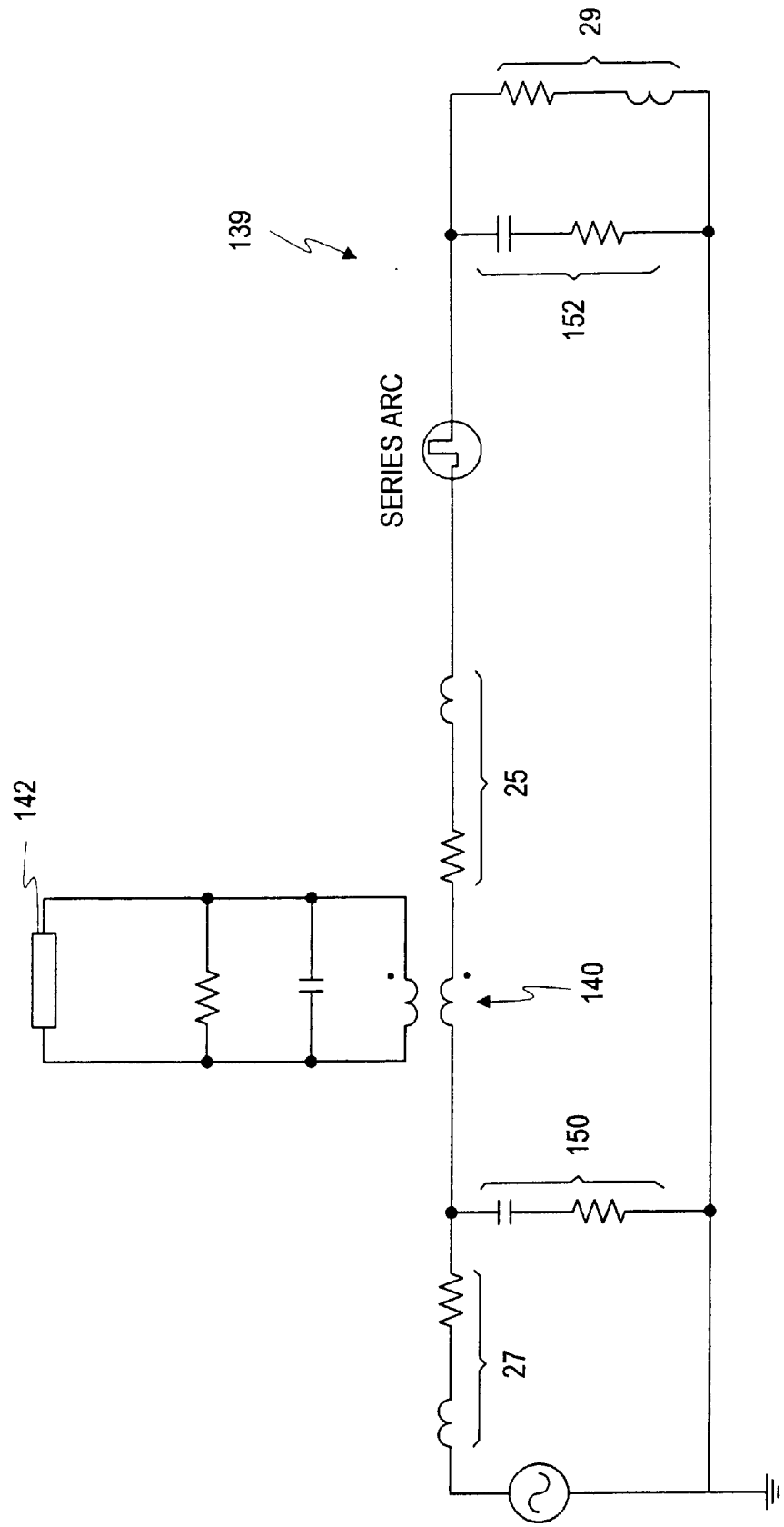
FIG. 15 is a simplified circuit schematic of a di/dt series arc detection system.

Referring now to FIG. 15, a circuit 139 for di/dt detection for series arcs is shown. This circuit utilizes a current transformer sensor 140 having a primary in series with the line and secondary coupled across a voltage sensing arc detector 142. The current sensor 140 may be a mutual inductor (air core) current sensor for producing an output voltage that is proportional to the noise generated by any arc voltage. The output voltage of the sensor 140 is then roughly proportional to the arc voltage divided by the inductance in series with the arc.

Relatively low inductance loads or shunt capacitance will allow relatively large di/dt arc signals. Shunt capacitance has the effect of reducing or resonating with the load inductance at some frequencies. Highly inductive loads such as motors will produce only a relatively quiet arc signal, whereas variable speed motor drives, which are primarily capacitive loads will allow relatively loud arc signals. Typically, however, the noise generated by a variable speed motor drive is even louder than the arc signal. The arc voltage typically contains many high frequency noise components such that rapid fluctuations in the arc voltage result in current fluctuations. The magnitude of these current fluctuations depends on the frequency response of the line and the connected loads at any given moment. The di/dt sensor 140 picks up all these fluctuations and cannot distinguish load-generated di/dt from arc-generated di/dt. Thus, relatively noisy loads may induce a trip signal using the di/dt sensor 140 as shown in FIG. 15. Moreover, high inductance loads attenuate di/dt, and arcs occurring in circuits with highly inductive loads are therefore difficult to detect with a di/dt sensor.

In order to improve the di/dt level during series arc faults with inductive loads, line-impedance stabilization networks (LISN) 150 and 152 are added to the circuit as shown in FIG. 15. These RC networks are loaded to both the line and load end of the wiring to enable tuning of the circuit and load combination to a desired frequency response. Connecting a shunt filter of this type with about one microfarad and a series 10 to 30 ohms resistance on each branch circuit at the load end tends to mask the effects on di/dt due to different load power factors, such that both resistive and inductive loads tend to produce similar arcing fault di/dt responses. The improved high frequency response achieved by this method allows relatively high level di/dt signals to be successfully monitored during a series arc fault with either an inductive or a resistive load.

Figure 16:
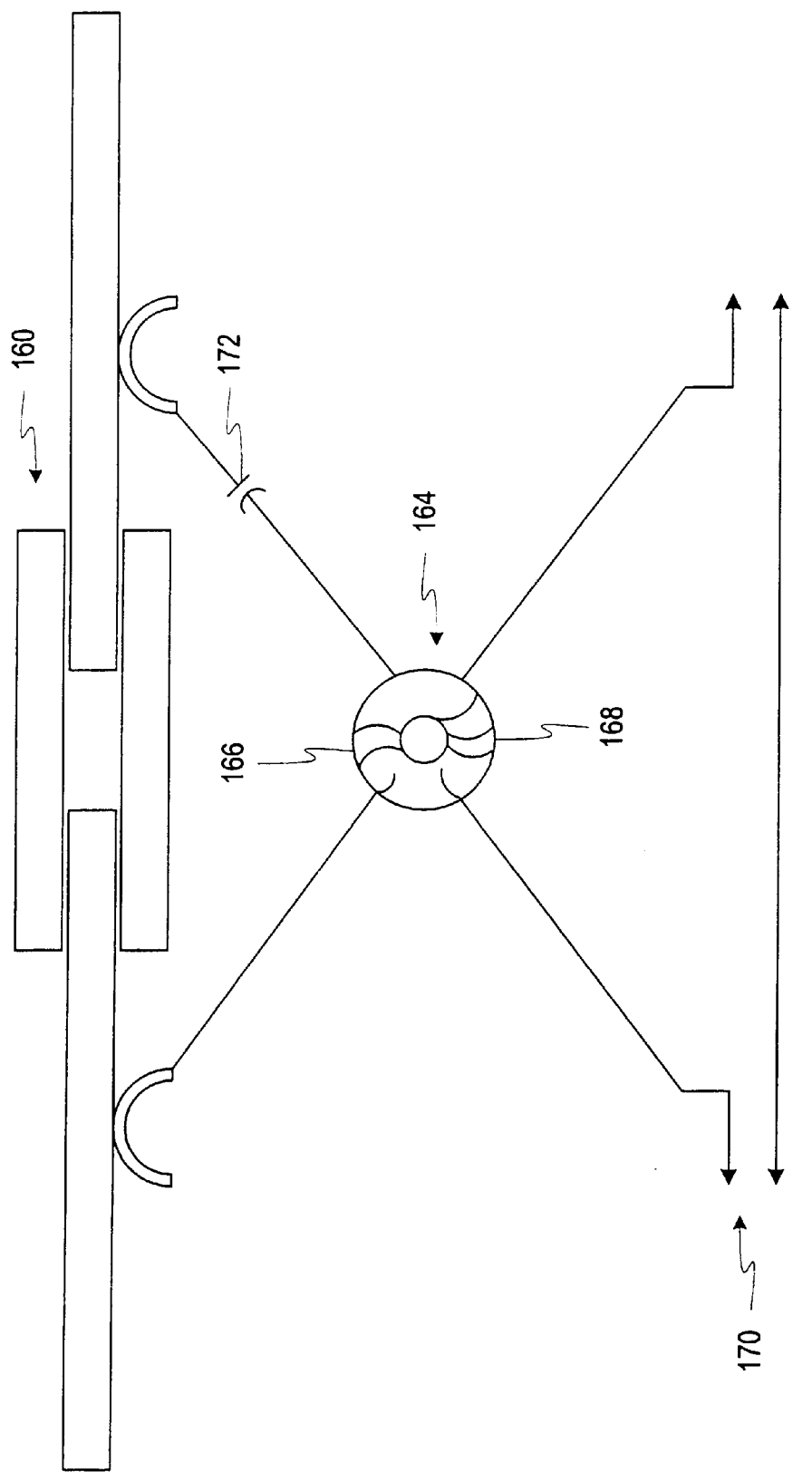
FIG. 16 is a simplified diagram of a bus joint monitor using a toroidal sensor.
Figure 17:
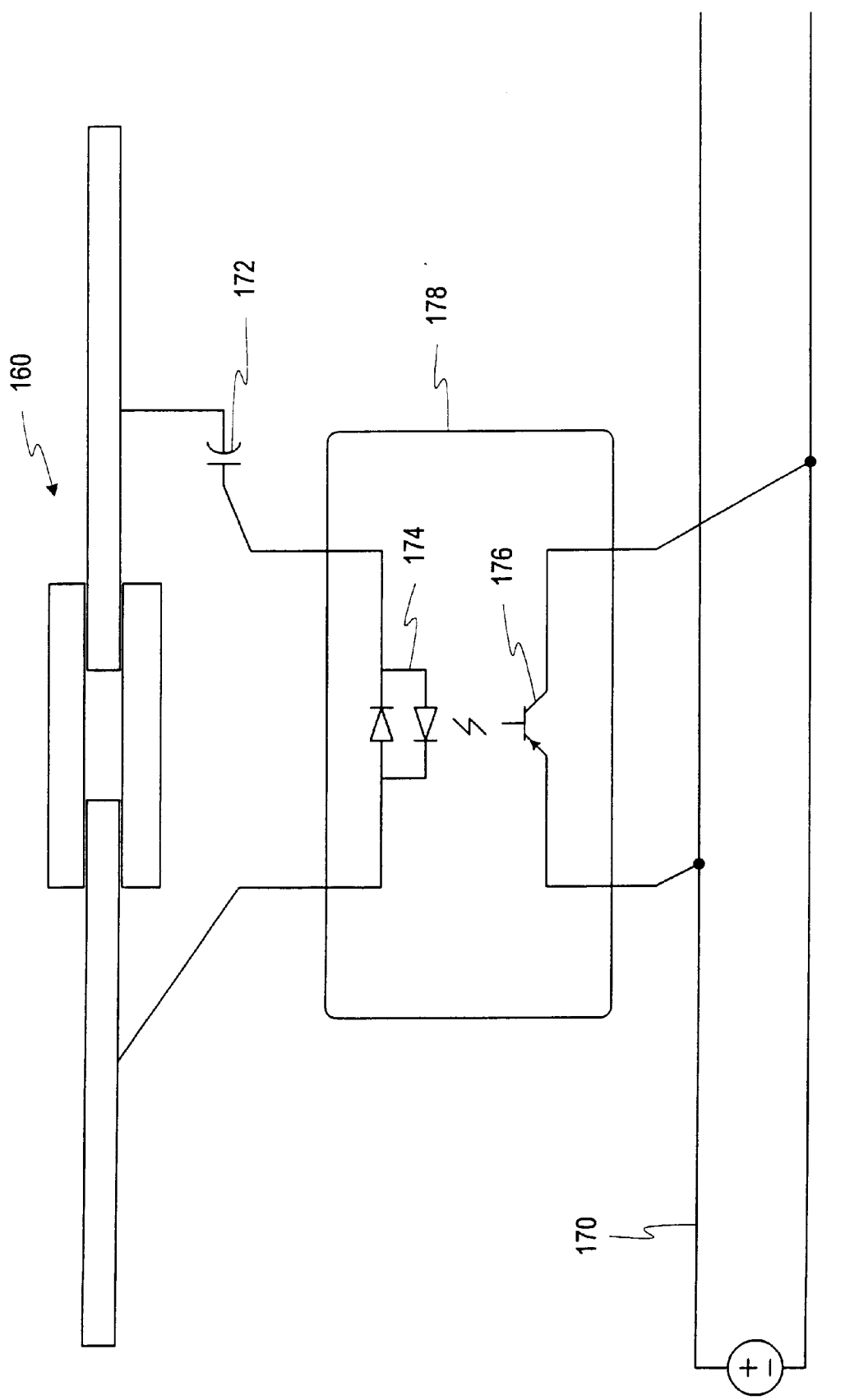
FIG. 17 is a simplified diagram of a bus joint monitor using an optical sensor.

Zones in various types of electrical systems may be identified and defined in various ways in order to achieve arc protection using one or more of the foregoing methods or circuits for arc protection. In addition to the foregoing methods, critical joints (e.g., joints between wires, terminals, connectors, contacts, etc.) in an electrical system might be monitored separately, as indicated in FIG. 16 and FIG. 17 by a sensor operatively coupled for monitoring each joint, and with the multiple sensors in such a system being connected with twisted pair conductors. A joint having an arc voltage such as the joint 160 in FIGS. 16 and 17 would typically develop a detectable voltage drop during an arcing event. The sensor would then respond to this voltage drop across the joint by generating a corresponding signal which would be sent through the twisted pair conductor to a suitable detector circuit (not shown).

In the sensing scheme shown in FIG. 16, a two-winding toroid 164 has one of its windings 166 operatively coupled across or in parallel with the joint 160, and a second winding 168 coupled in series with the twisted pair 170. This circuit also permits bidirectional testing of the joint in that an AC current applied to the twisted pair 170 will result in a current being induced in the joint 160. Thus, any joint which is open will result in a measurable impedance increase in the twisted pair network. A fully open circuit in the joint will generate a large current in the primary winding 166, such that a current limiting impedance such as a capacitor 172 is preferably added in series with the primary winding 166. Alternatively, an overcurrent protection such as a fuse (not shown) might be used.

In FIG. 17, a similar circuit utilizes an optical sensing scheme to develop a signal in a twisted pair network in response to an arcing voltage across a joint 160. For example, an LED 174 requires only a few volts and milliamp level currents to operate. The light from the LED could be picked up directly by a fiber optic (not shown) over short distances or operate an opto-coupler switch 176. The LED 174 and opto-coupler switch 176 may be packaged as an opto-isolator 178. The LED can be protected from overcurrents from a completely open joint 160 with a current limiting capacitor 172 in similar fashion to the circuit of FIG. 16 described above. Multiplexing could be used with respect to the opto-isolaters connected in parallel along the twisted pair network 170 so as to be able to individually identify a problem joint where arcing is occurring. The characteristic threshold voltage of the LED 174 could also be used for a voltage differential monitoring of several feet of bus or wire for excessive voltage drops due to arcing faults.

It will be appreciated that the above-described methods for detecting arcing in a joint can be applied across terminals, contacts, or at any point in a circuit where a series arc may occur in a relatively short length of circuitry. Thus, the term "joint" as used herein is to be given a broad meaning, consistent with the latter observations.

A number of other electrical system components and elements may lend themselves to arc fault detection using one or more of the schemes hereinabove.

A panelboard can be thought of as a short bus section with many taps. An arc in a panelboard can start as insulation flashover or as a bus bar joint deterioration. The flashover type will cause high phase-phase fault currents and will trip the overcurrent protection device if the fault is within the instantaneous overcurrent protection zone. For protection of multiple taps, a di/dt sensor may be used for series arcs with quiet loads. The joints in busway have high reliability but occasionally one may deteriorate and arc. Series arcing will likely coincide with loads starting up and high inrush currents which create peak vibrations and hot contact spots. For bus sections with few high current tees, a zero-sequence voltage arc detection scheme (e.g., FIG. 3) could be used with zero-sequence voltage sensing at each tee section.

Series arcs anywhere on the system will generate some di/dt noise levels, especially if resistive or capacitive load is connected. Small changes in load capacitance and resistance can cause large swings in di/dt signal magnitude. This effect can be visualized as a change in the impedance of the network seen from the point of view of the arc. The loop impedance controls the high frequency current flow. Changes in capacitance or resistance on either the line or load side of the arcing point changes the loop impedance and will change the amount of transmitted di/dt signal.

Branch and cable feeders include insulated wires in troughs, wireways, and conduit. Close proximity between different branches and phases couples high frequency signals. Arcing faults are unlikely except where vibration chaffs insulation or loosens connections. Abrasions are the most likely places to start line-to-ground faults which evolve into line-to-line faults. Arcing faults in the neutral conductor are the most difficult to find because of the low neutral to ground potential. Ground fault CTs would protect against the majority of cable faults where a grounded surface is near the arc. Differential current monitoring schemes (e.g., FIG. 2) provide a method for ground and phase-phase arcing faults, using pilot wire runs as long as the phase conductors.

A zero-sequence voltage differential scheme (e.g., FIG. 3) can be used to define a series arcing fault detection zone. The detection zone is the series conductive path between voltage sensors at the beginning and the end of the wire. The monitored arcing signal is independent of the loads on the branch circuits. Series arcs in circuits tapped off of the zone cannot be detected with this method. Some ground faults can be detected. Phase to phase faults will not appear as zero-sequence voltage differences and require protection by overcurrent devices or differential current monitoring (e.g., FIG. 2).

Sensing di/dt may offer an arcing fault detection scheme for special case cable systems or zones where load noise is low and predictable. Preventing false trips due to normal switching events which appear as series arcs may be difficult, such that these zones should not include switching operations.

Internal insulation failure of a transformer winding may cause arcing. Large transformers often have over-pressure relays which respond to internal winding failures. Faults to ground (the core or tank) can be detected as standard ground fault currents using differential relaying.

Motors have arc detection solutions similar to transformers. One difference between motors and transformers is that the probability is higher of phase-to-phase arcs in the slots and end turns of motors. Another is that virtually all three-phase motors have ungrounded neutral points to avoid third harmonic currents. Ground faults are easily detected since zero-sequence currents are present only during a fault. Motors have the characteristic that rotor currents are induced which oppose changes in the stator flux due to turn-to-turn shorts. Vibration is higher and insulation break down is many times more likely. Arc generated di/dt signals are attenuated compared to ambient noise levels.

One technique to detect phase-to-phase coil faults involves differential current monitoring (e.g., FIG. 2) on each phase winding. All motor winding leads are brought out of the motor so that three CTs monitor the difference between current entering and exiting each phase winding. Any leakage current is detected as a fault.

Motor Control Centers can be handled similarly to panelboards and bus sections. Ground fault detection would detect shunt arcs to ground but not series arcs. The short distance of the motor control bucket makes "pilot wire" series arc detection (e.g., FIG. 3) attractive. In the motor control buckets the contactors and switches will generate arcs each time the devices operate. Series arcs of a couple cycles duration are part of normal contactor operation and must be anticipated. The arc detection should be restrained from operating during normal switching operations in the zone. The restraint can be accomplished by auxiliary contacts which operate before the main contact switching action. Alternatively, separate zones can be defined for each component in the current path. Inverse time to trip characteristics on arc voltage signal can be employed to allow normal arcing time during operation of each component. The zero-sequence voltage differential method FIG. 3 offers the advantages of detecting series arcs by compensating for similar contactor arc voltages in the three phases and extending the protection zone through the connections to the bus feed section.

Motor drives tend to generate more di/dt noise than typical arcs. Detection of arcs in series with unfiltered drives using di/dt is therefore difficult. The drive current can be filtered by adding inductance to the line and load sides of the drive to improve di/dt type arc detection. The zero-sequence voltage method (e.g., FIG. 3) was found to distinguish arc voltage without need of inductive filtering. Series arcs appeared in the zero-sequence voltage signal without the high frequency noise apparent in the di/dt signal. A similar arc detection scheme is possible between drive and motor but more induced noise will be found on the pilot wire.

What has been illustrated and described herein is a number of methods for detecting arcing faults in various applications. As described above, shunt arcing fault detection may use differential current monitoring of each phase conductor in a zone, where CTs at beginning and end of zone are summed to generate a fault current signal. Ground fault detection by a single zero-sequence CT detects arcing faults to ground but not line-line or series arcs. Series arcs may be detected by monitoring the difference between the zero-sequence voltage of the source with the zero-sequence voltage of the load end of the zone. This method is independent of the load and source impedances. An inverse-time trip curve based on this zero-sequence voltage difference is a reasonable series arc zone protection scheme. This method requires a defined zone beginning and end and cannot extend indefinitely to all connected loads. Series arcs occuring in loads tapped off of the zone are not detected by this method. However, differential phase current detection may also be used to detect series arcs, as may the voltage drop and power loss methods described above. Arrangements such as shown in FIGS. 16 and 17 may be used to detect series arcing in joints or across similar connectors or contacts. The di/dt method for arc detection is simple to implement; however, the arc signal has high signal to noise ratio only for quiet resistive or capacitive loads. Some crosstalk of dt/dt signals between branches has been observed. Switching operations and solid state components also produce high frequency di/dt signals which could be mistaken for faults.

What is claimed is:

1. A zone arc fault detection system for detecting arc faults in a defined zone of an electrical circuit, comprising:

a zero-sequence differential voltage arc detector for detecting series arcing faults and including:

voltage summing means for summing the voltages of all phases of said circuit at both source and load ends of said zone; and comparing means for comparing the sum of the voltages at one of said load and source ends of each phase and the sum of the voltage that the other said load and source ends of each phase and for producing a difference signal corresponding to any difference therebetween.

2. The system of claim 1, and said zero-sequence differential voltage arc detector further including arcing fault detector means responsive to the magnitude of said difference signal being above a predetermined threshold value for producing a trip signal.

3. The system of claim 1 and further including compensating means for providing compensation for a circuit wherein a neutral conductor has a much higher impedance than the phase conductors or wherein the neutral conductor shares large currents from other branches.

4. The system of claim 1 and further including a ground fault detector for detecting a ground fault anywhere in the electrical circuit.

5. The system of claim 1 wherein said voltage summing means comprises a plurality of matched resistors, each resistor having a first end coupled to one of the load and source ends in said zone of each phase of said circuit; and wherein said comparing means has one input coupled to an end opposite said first end of each of said matched resistors coupled to source ends of each phase and a second input coupled to an end opposite said first end of each of said matched resistors coupled to the load end of each phase.

6. The system of claim 5 wherein said electrical circuit is a three phase line and wherein said matched resistors coupled to each of said source and load ends are wye-connected.

7. The system of claim 5 and further including trip control means responsive to predetermined conditions in said zone for alternatively enabling and disabling said trip signal.

8. The system of claim 7 wherein said trip control means is responsive to the opening of any switch device in the zone for disabling said trip signal.

9. The system of claim 1 and further including a differential phase current arc detector.

10. The system of claim 9 wherein said differential phase current arc detector comprises a pair of substantially identical parallel insulated conductors for each zone of each conductor to be protected by said differential phase current detector thereby defining a protected zone comprising the length of said parallel conductors between two points at which the two conductors are coupled together; and a transformer current sensor inductively coupled with each said pair of parallel conductors, said transformer current sensor and said conductors being respectively configured and arranged such that the current induced in said current transformer sensor from one of said conductors is subtracted from the current induced in said transformer current sensor from the other said conductors to produce a difference current output.

11. The system of claim 10 and further including further arcing fault detector means responsive to the magnitude of any of said difference current outputs exceeding a predetermined threshold value for producing a trip signal.

12. The system of claim 10 and further including a ground fault detector for detecting a ground fault anywhere in the electrical circuit.

13. The system of claim 1 and further including a differential current arc detector.

14. The system of claim 13 wherein said differential current arc detector comprises a current sensor for developing a current signal corresponding to the current at each of said load and source ends of each phase in said zone; and current summing means coupled to said current sensors for receiving said current signals and summing the current signals from each of the source ends with opposite sense current signals from a corresponding one of the said load ends.

15. The system of claim 14 and further including second arcing fault detector means responsive to the magnitude of any of the summed current signals from said current summing means being above a predetermined threshold value for producing a trip signal.

16. The system of claim 14 and further including an additional current sensor at each tap location within the zone, said current summing means further summing the current signals from the additional current sensors with the current signals from the current sensors at the load end and the source end of said zone, respectively.

17. The system of claim 14 and further including a ground fault detector for detecting a ground fault anywhere in the electrical circuit.

18. The system of claim 14 and further including a differential phase current arc detector.

19. The system of claim 18 wherein said differential phase current arc detector comprises a pair of substantially identical parallel insulated conductors for each zone of each conductor to be protected by said differential phase current detector thereby defining a protected zone comprising the length of said parallel conductors between two points at which the two conductors are coupled together; and a transformer current sensor inductively coupled with each said pair of parallel conductors, said transformer current sensor and said conductors being respectively configured and arranged such that the current induced in said current transformer sensor from one of said conductors is subtracted from the current induced in said transformer current sensor from the other said conductors to produce a difference current output.

20. The system of claim 19 and further including further arcing fault detector means responsive to the magnitude of any of said difference current outputs exceeding a predetermined threshold value for producing a trip signal.

21. A zone arc fault detection system for detecting arcing faults in a defined zone of an electrical circuit, comprising: a differential phase current detector including a pair of substantially identical parallel insulated conductors for each zone of each conductor to be protected by said differential phase current detector thereby defining a protected zone comprising the length of said parallel conductors between two points where the two conductors are coupled together, a transformer current sensor inductively coupled with each said pair of parallel conductors, said transformer current sensor and said conductors being respectively configured and arranged such that the current induced in said current transformer sensor from one of said conductors is subtracted from the current induced in said current transformer sensor from the other said conductors to produce a difference current output.

22. The system of claim 21 and further including arcing fault detector means responsive to the magnitude of any of said difference current outputs exceeding a predetermined threshold value for producing a trip signal.

23. The system of claim 21 and further including a ground fault detector for detecting a ground fault anywhere in the electrical circuit.

24. The system of claim 21 and further including a differential current arc detector.

25. The system of claim 24 wherein said differential current arc detector comprises a current sensor for developing a current signal corresponding to the current at each of said load and source ends of each phase in said zone; and current summing means coupled to said current sensors for receiving said current signals and summing the current signals from the source ends with opposite sense current signals from said load ends.

26. The system of claim 25 and further including second arcing fault detector means responsive to the magnitude of the summed current signals from said current summing means being above a predetermined threshold value for producing a trip signal.

27. The system of claim 25 and further including an additional current sensor at each tap location within the zone, said current summing means further summing the current signals from the additional current sensors with the current signals from the current sensors at the load end and the source end of said zone, respectively.

28. A zone arc fault detector system comprising:

a differential current arc detector for detecting line-to-line and ground fault arcing conditions; and a differential voltage arc detector for detecting series arcing faults.

29. The system of claim 28 wherein said differential voltage arc detector comprises a zero-sequence differential voltage arc detector.

30. The system of claim 28 and further including a differential phase current detector for detecting both series and parallel arcing faults.

31. The system of claim 30 wherein said differential voltage arc detector comprises a zero-sequence differential voltage arc detector.

32. The system of claim 28 and further including a ground fault detector.

33. The system of claim 28 wherein said differential voltage arc detector comprises a zero-sequence differential voltage arc detector.

34. A zone arc detection system comprising a differential voltage arc detector for detecting series arc faults and a differential phase current detector for detecting both series and parallel arcing faults.

35. The system of claim 34 wherein said differential voltage arc detector comprises a zero-sequence differential voltage arc detector.

36. The system of claim 35 and further including line impedance compensating means for removing the effect of line impedance caused voltage drop from said difference signal.

37. The system of claim 35 and further including a current transformer adjacent a source end of said line in said zone, and arc detection means responsive to said current transformer for producing a signal in response to a series arcing fault in said line conductor.

38. The system of claim 37 and further including a line-impedance stabilization network coupled with the both source and load ends of said zone.

39. The system of claim 38 wherein each said line impedance stabilization network comprises a shunt-connected RC filter.

40. A zone arc fault detector system comprising:

a differential current arc detector for detecting line-to-line and ground fault arcing conditions; and a differential phase current detector for detecting both series and parallel arcing faults.

41. A zone arc fault detection system for detecting series arc faults in a defined zone of electrical circuit, comprising:

voltage sensing means for sensing the voltage in a line conductor of said electrical circuit at both source and load ends of said zone; and arc detector means coupled with said sensing means for producing a difference signal corresponding to any differences between the voltages at the source and load ends of said zone.

42. The system of claim 41 and further including a ground fault detector for detecting a ground fault anywhere in the electrical circuit.

43. A zone arc fault detection system for detecting arc faults in a defined zone of an electrical circuit, comprising:

a current transformer operatively coupled with a line conductor of said electrical circuit for producing a current signal corresponding to an electrical current in said line conductor;

an arc detector coupled with said current transformer for detecting a change in current due to a series arcing fault on said line conductor; and a line impedance stabilization network coupled with source and line ends within the defined zone of said line conductor.

44. The system of claim 43 wherein said line impedance stabilization network comprises a shunt RC filter coupled with the source and load ends respectively of said line conductor within said zone.

45. The system of claim 43 and further including a ground fault detector for detecting a ground fault anywhere in the electrical circuit.

46. A zone arc fault detection system for detecting arc faults in a defined zone of electrical circuit, comprising:

voltage sensing means coupled with each of source and load ends within a zone of a line conductor of said electrical circuit;

a current sensor coupled with said line conductor of said electrical circuit adjacent the source end of said zone; and an arc power detector operatively coupled with said voltage sensors and with said current sensor for detecting any power loss through the line conductor in said zone corresponding to a series arc in said line within said zone.

47. The system of claim 46 wherein said arc power sensor further includes means responsive to the magnitude and time duration of the sensed arc power for producing a trip signal when the magnitude and time duration exceed predetermined threshold values.

48. The system of claim 46 and further including a ground fault detector for detecting a ground fault anywhere in the electrical circuit.

49. A zone arc fault detection system for detecting arc faults in a defined zone of an electrical circuit, comprising:

voltage summing means for summing the voltages of all phases of said circuit at both source and load ends of said zone;

comparing means for comparing the sum of the voltages of the phases at the other of said load and source ends and the sum of the voltages of the phases at the other of said load and source ends and for producing a difference signal corresponding to any difference therebetween;

a differential current arc detector; and ground fault sensor means comprising a current transformer sensor operatively coupled with line and neutral conductors of said electrical circuit for detecting a difference in current therebetween and producing a corresponding ground fault signal.

50. The system of claim 49 and further including arcing fault detector means responsive to the magnitude of the voltage difference signal being above a predetermined threshold value for producing a trip signal and responsive to the magnitude of said ground fault signal being above a predetermined threshold value for producing a trip signal.

51. A system for monitoring for arcing faults in a joint of an electrical circuit, said system including means for monitoring for a voltage differential across said joint and for producing a corresponding arcing fault signal.

52. The system of claim 51 wherein said means for monitoring comprises a two-winding toroid, having the first winding coupled across said joint and a second winding for producing said arcing fault signal.

53. The system of claim 52 wherein said secondary winding is coupled in a monitoring network.

54. The system of claim 53 wherein said monitoring network comprises a network for interconnecting a parallelity of said secondary windings in a series circuit configuration.

55. The system of claim 51 wherein said detector comprises a light emitting diode (LED) coupled across said joint to be monitored.

56. A system of claim 55 wherein said detector further includes means responsive to light from said LED for producing an arcing fault signal.

57. A system of claim 55 wherein said detector further includes an optical switch responsive to light from said LED for producing a corresponding arcing fault signal.

58. The system of claim 57 wherein said optical switch is coupled in a network for monitoring a plurality of joints and including means for identifying any one of said plurality of joints at which an arcing fault occurs in response to the corresponding arcing fault signal.

59. The system of claim 58 wherein said network includes a twisted pair of network conductors operatively coupled to a plurality of said optical switches, each associated with one of said joints to be monitored.

\* \* \* \* \*